(12) United States Patent
Takewaki et al.

(10) Patent No.: US 7,479,700 B2
(45) Date of Patent: Jan. 20, 2009

(54) SEMICONDUCTOR DEVICE FEATURING COPPER WIRING LAYERS OF DIFFERENT WIDTHS HAVING METAL CAPPING LAYERS OF DIFFERENT THICKNESS FORMED THEREON, AND METHOD FOR MANUFACTURING THE SAME

(75) Inventors: Toshiyuki Takewaki, Kawasaki (JP); Kazuyoshi Ueno, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 311 days.

(21) Appl. No.: 11/325,425

(22) Filed: Jan. 5, 2006

(65) Prior Publication Data

US 2006/0157854 A1    Jul. 20, 2006

(30) Foreign Application Priority Data

Jan. 14, 2005    (JP)    ............................... 2005-007505

(51) Int. Cl.
*H01L 23/48*    (2006.01)
*H01L 23/52*    (2006.01)

(52) U.S. Cl. ........................ 257/758; 257/751; 257/762; 257/E23.173

(58) Field of Classification Search ................ 257/758, 257/751, 762, E23.173
See application file for complete search history.

(56) References Cited

U.S. PATENT DOCUMENTS

| 5,898,222 | A  | * | 4/1999 | Farooq et al. | ................ | 257/762 |
| 7,138,717 | B2 | * | 11/2006 | Wang et al. | ................ | 257/760 |
| 2005/0110149 | A1 | * | 5/2005 | Osaka et al. | ................ | 257/758 |
| 2006/0001170 | A1 | * | 1/2006 | Zhang et al. | ................ | 257/762 |

FOREIGN PATENT DOCUMENTS

JP    2003-505882    2/2003

* cited by examiner

*Primary Examiner*—Nitin Parekh
(74) *Attorney, Agent, or Firm*—Young & Thompson

(57) ABSTRACT

In a semiconductor device, an insulating interlayer is provided above a semiconductor substrate, and a plurality of first wiring layers and a plurality of second wiring layers are formed in the insulating interlayer. The first wiring layers are substantially composed of copper, and are arranged in parallel at a large pitch. The second wiring layers are substantially composed of copper, and are arranged in parallel at a small pitch. A first metal capping layer is formed on each of the first wiring layers, and a second metal capping layer is formed on each of the second wiring layers. The second metal capping layer has a smaller thickness than that of the first metal capping layer.

10 Claims, 19 Drawing Sheets

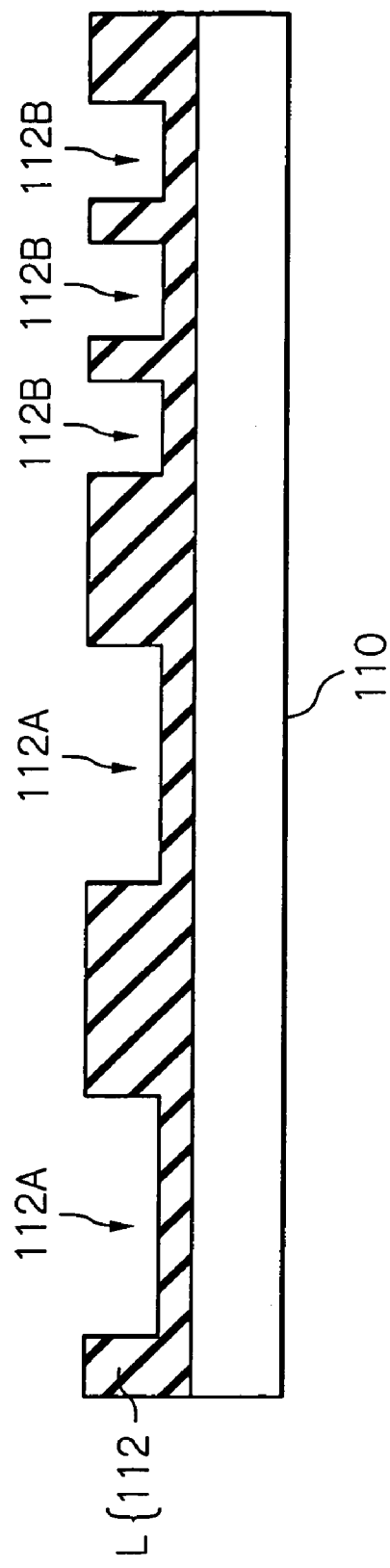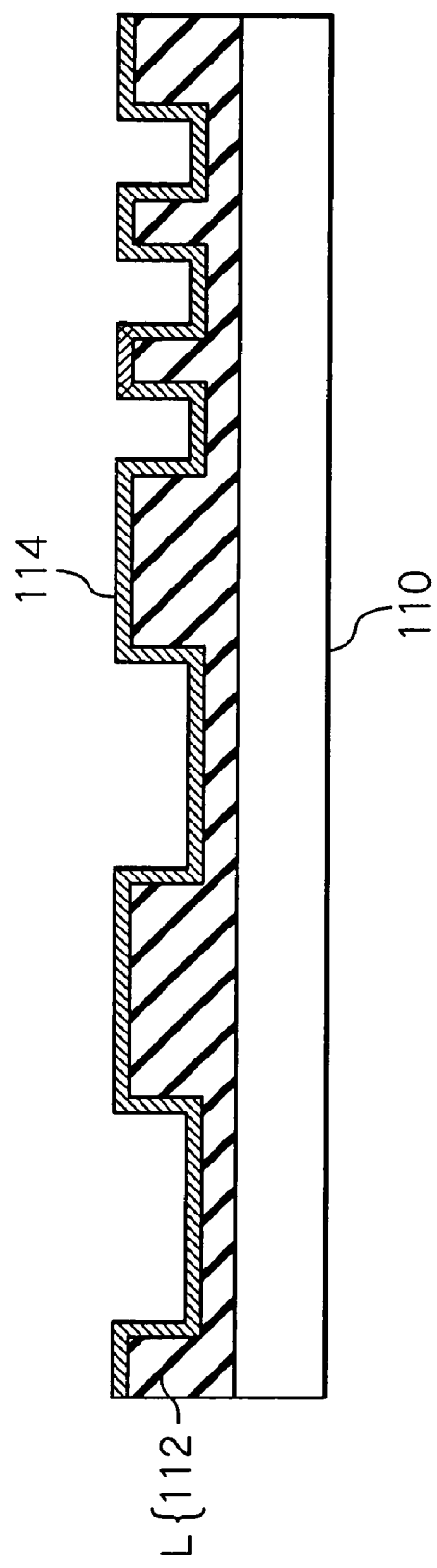

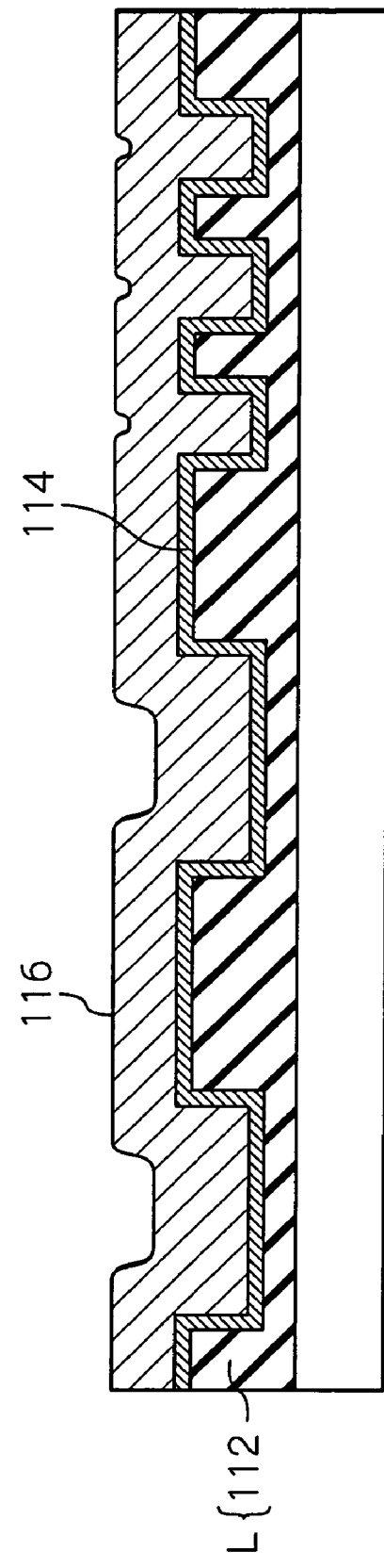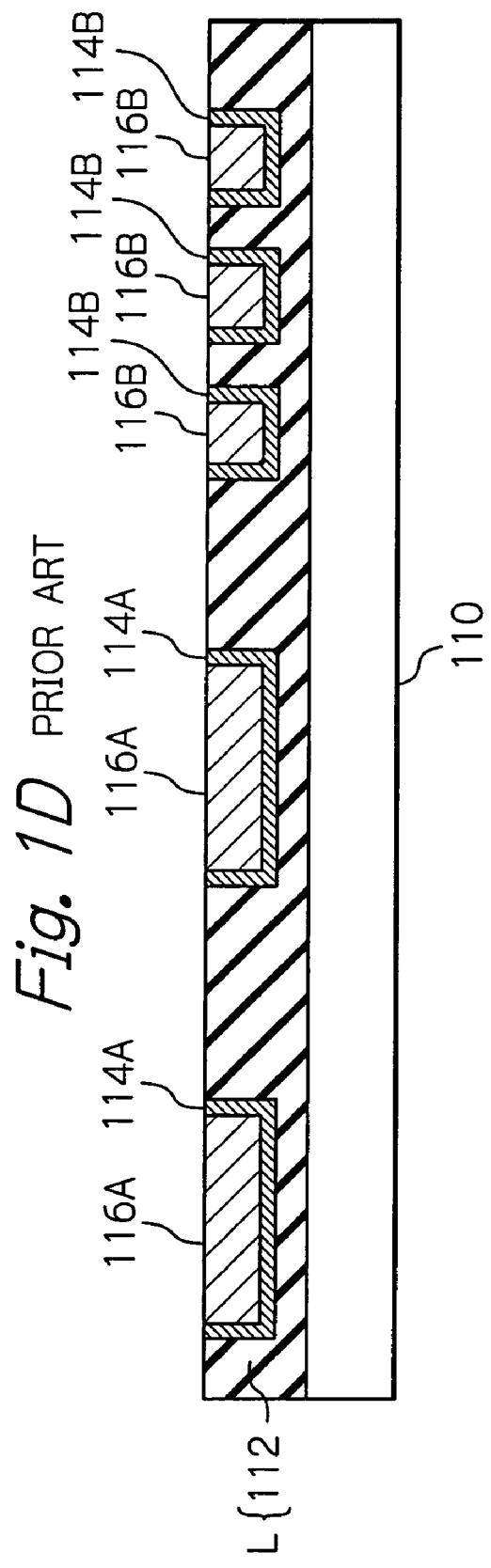

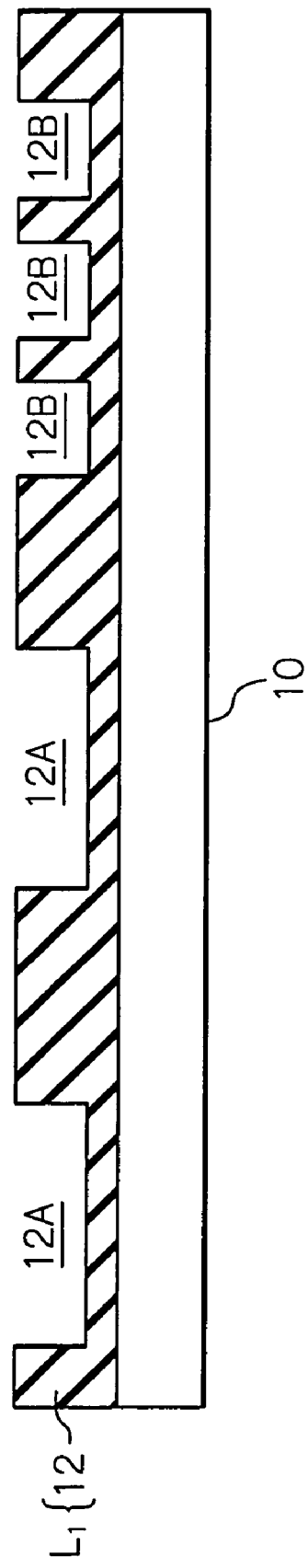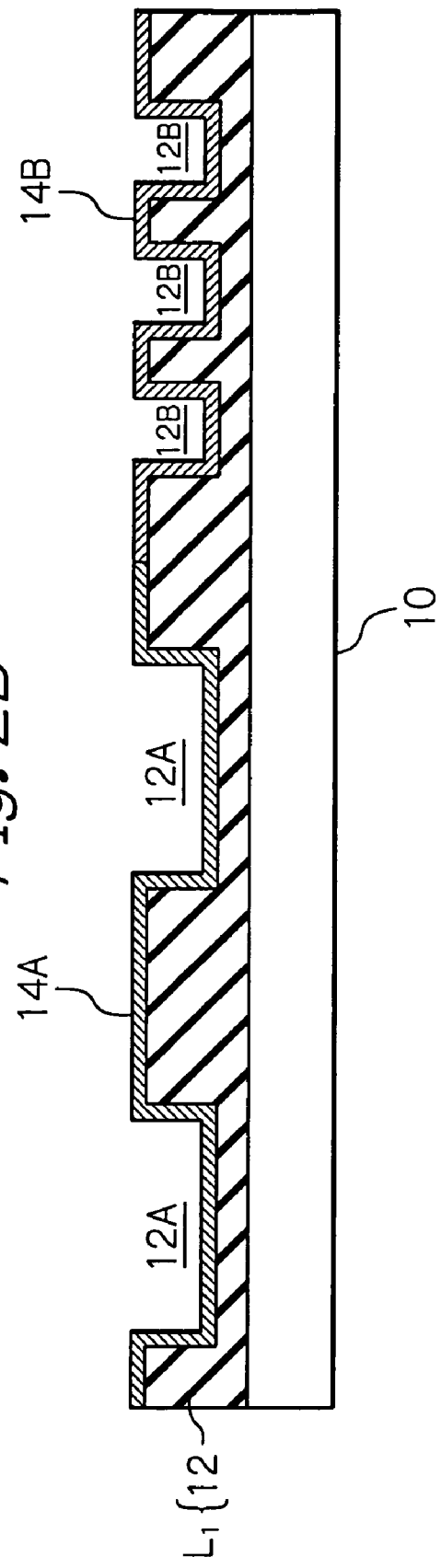

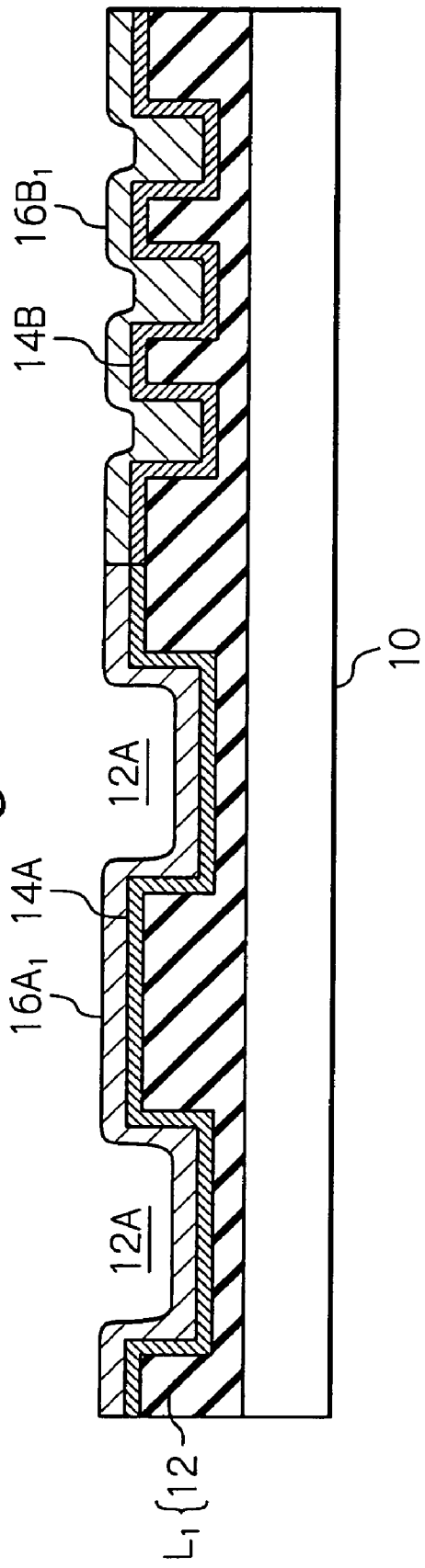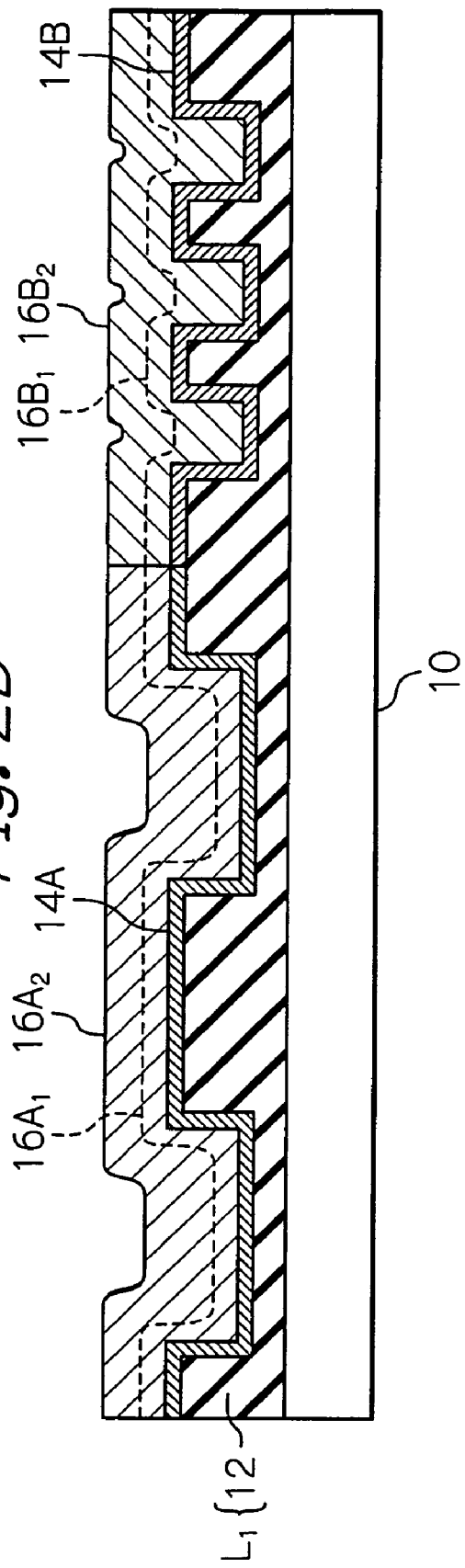

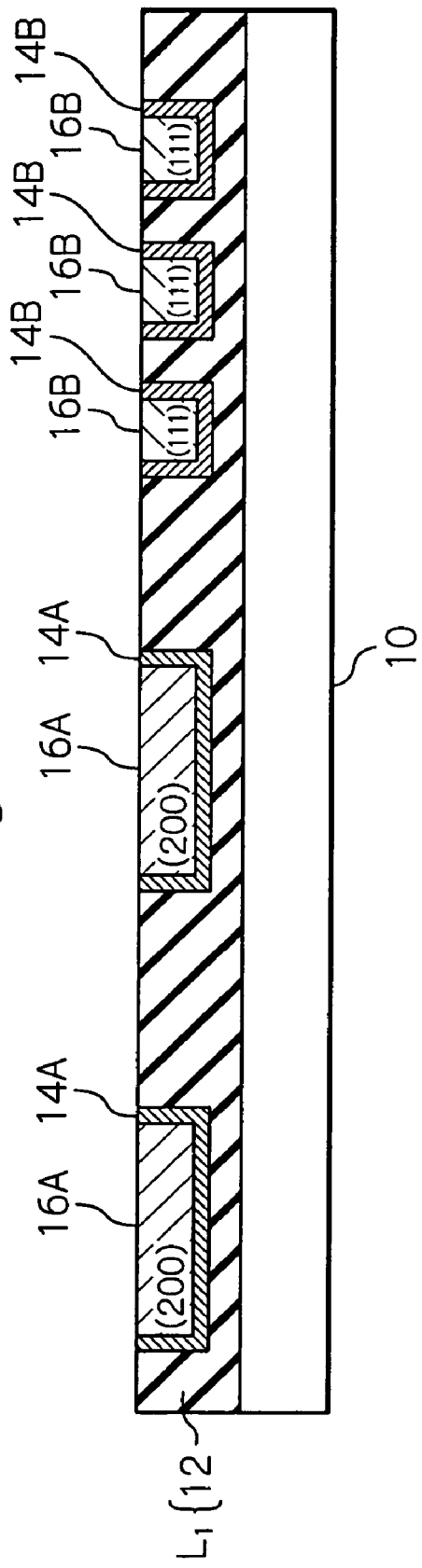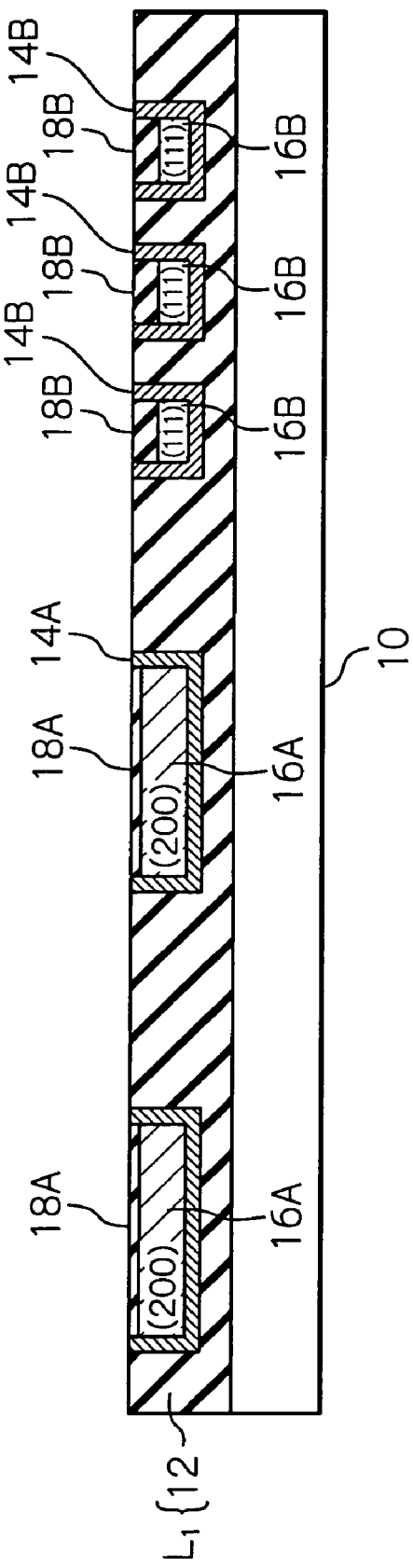

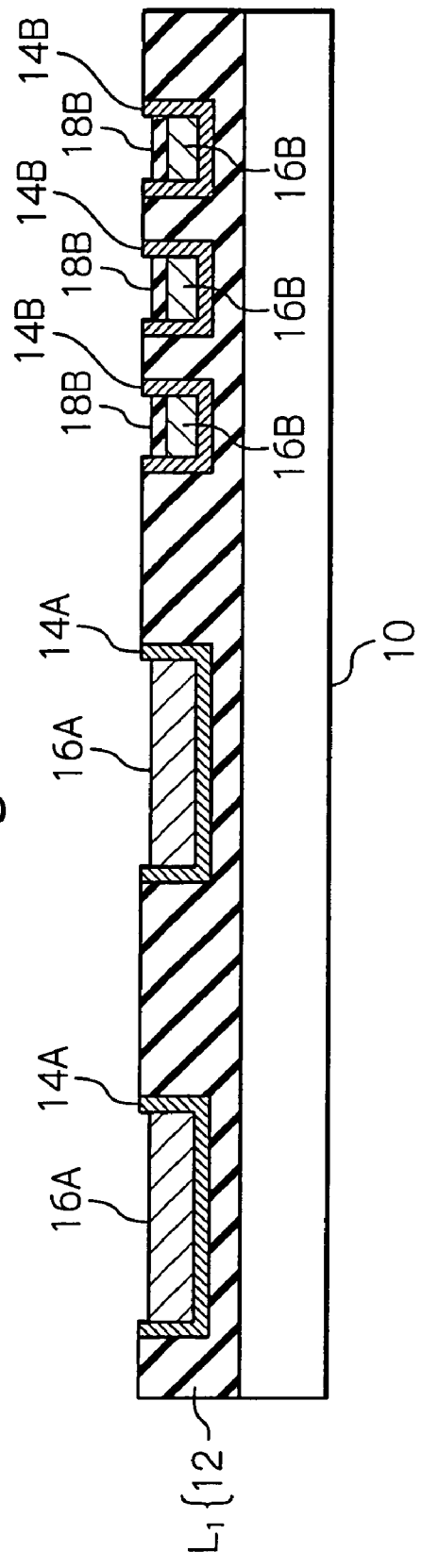
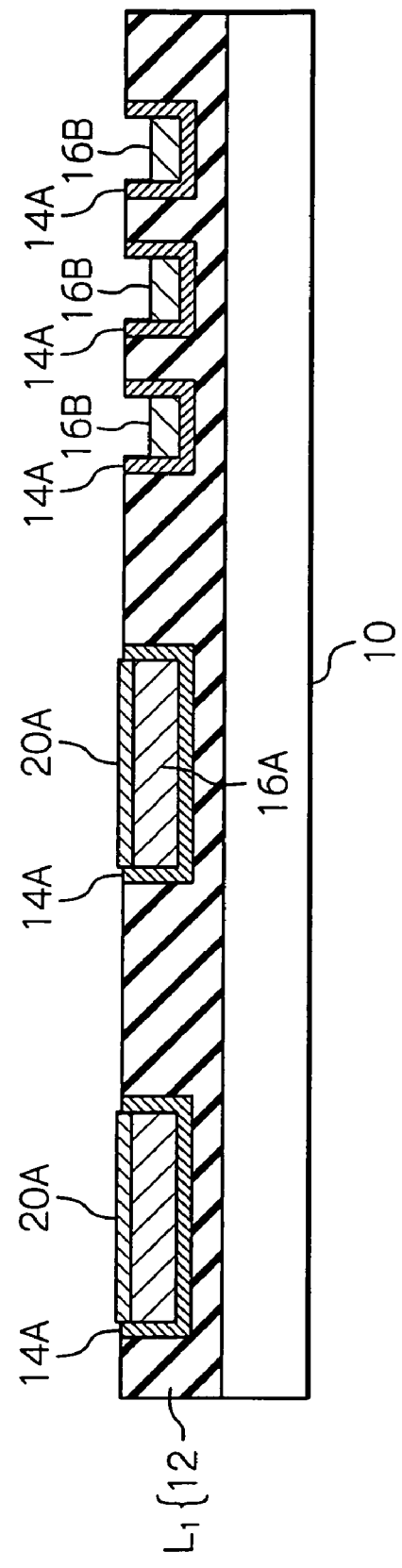

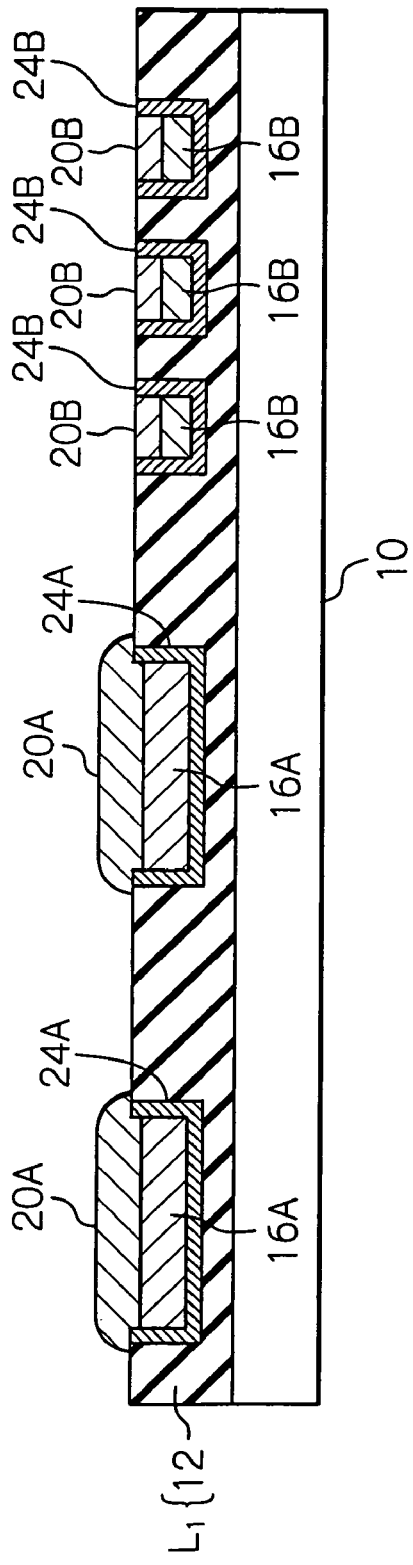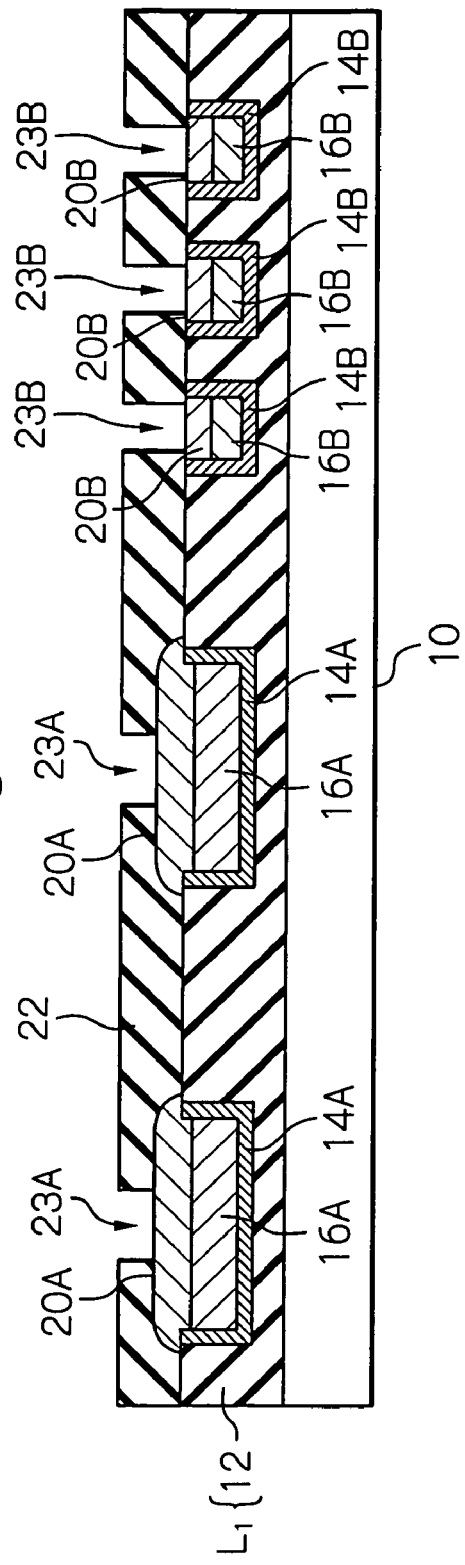

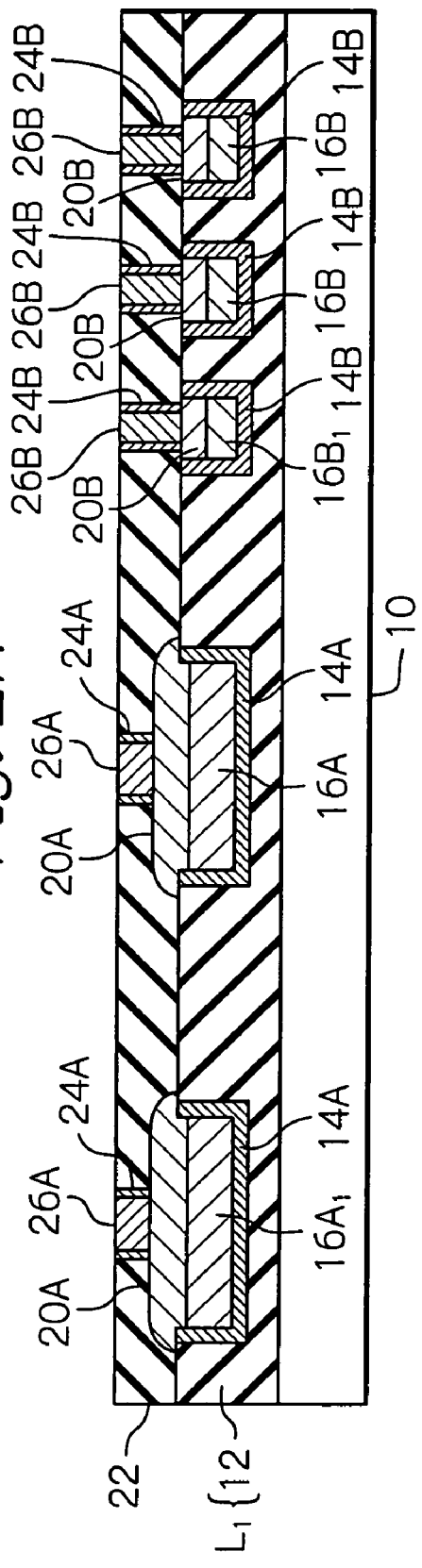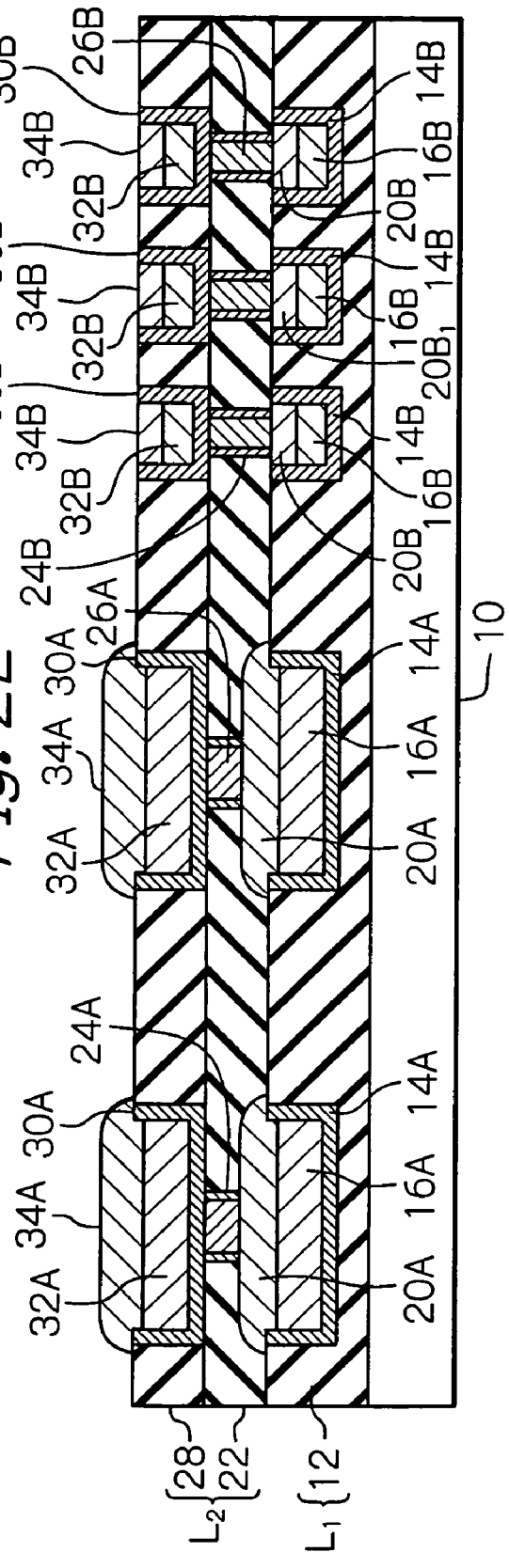

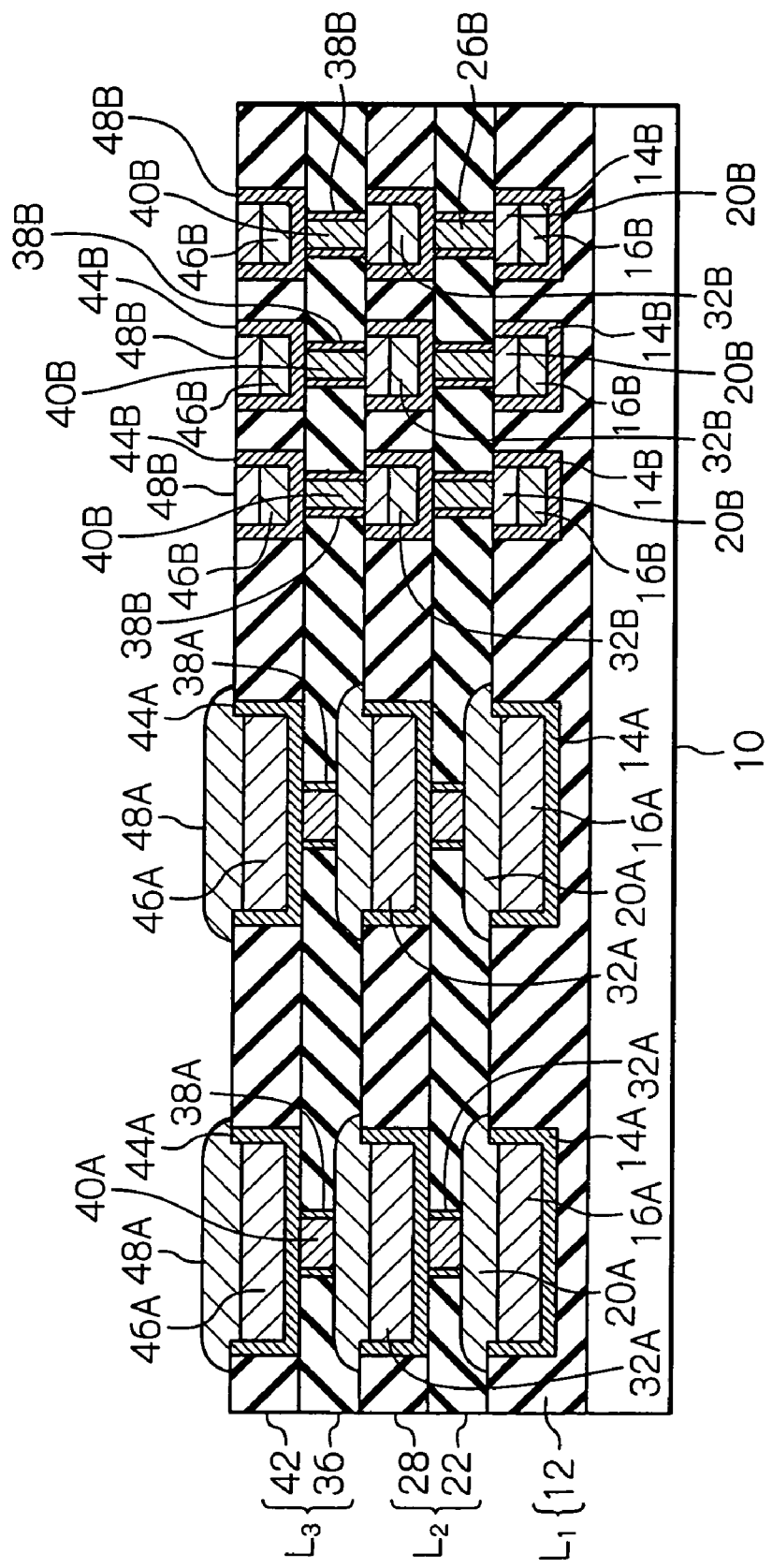

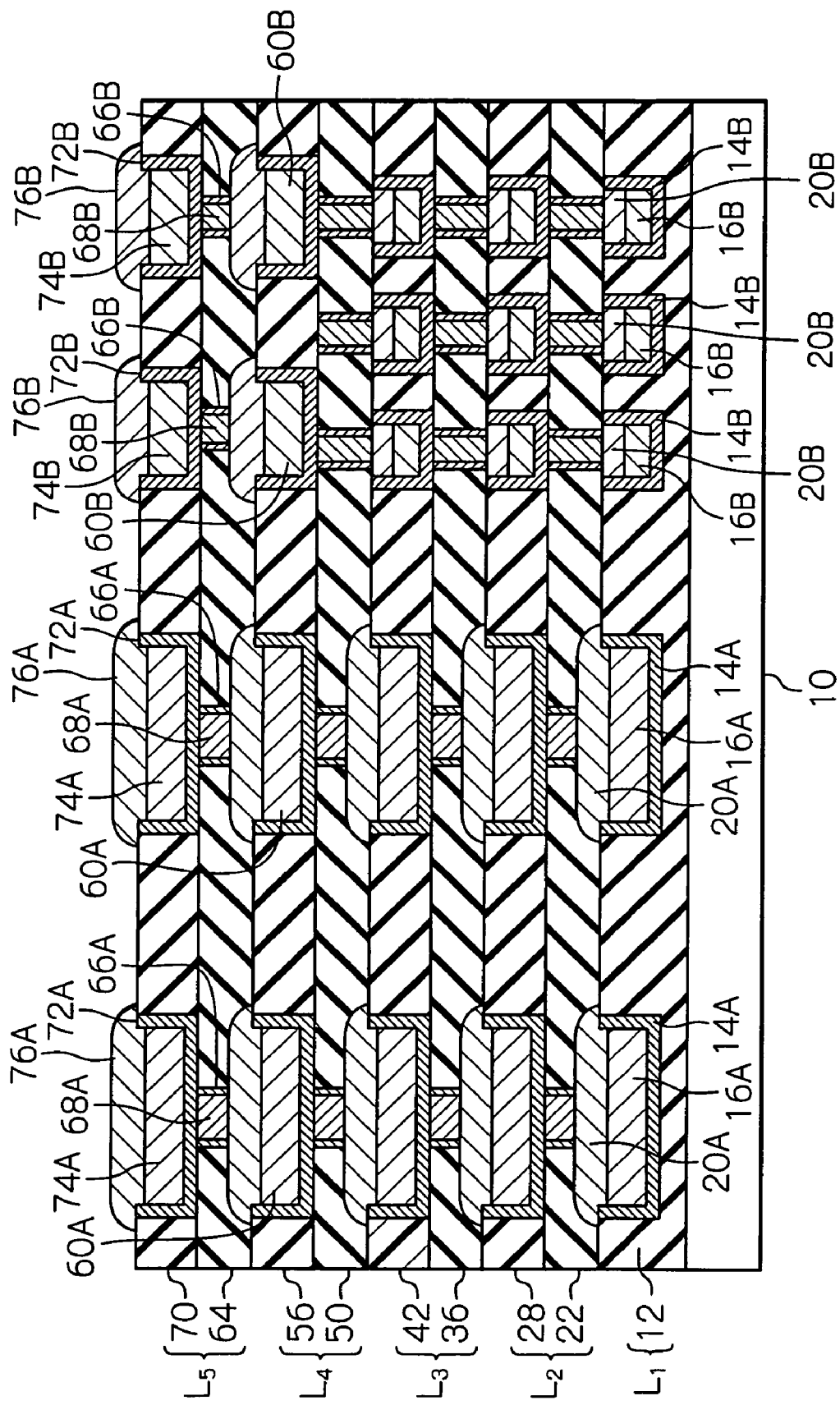

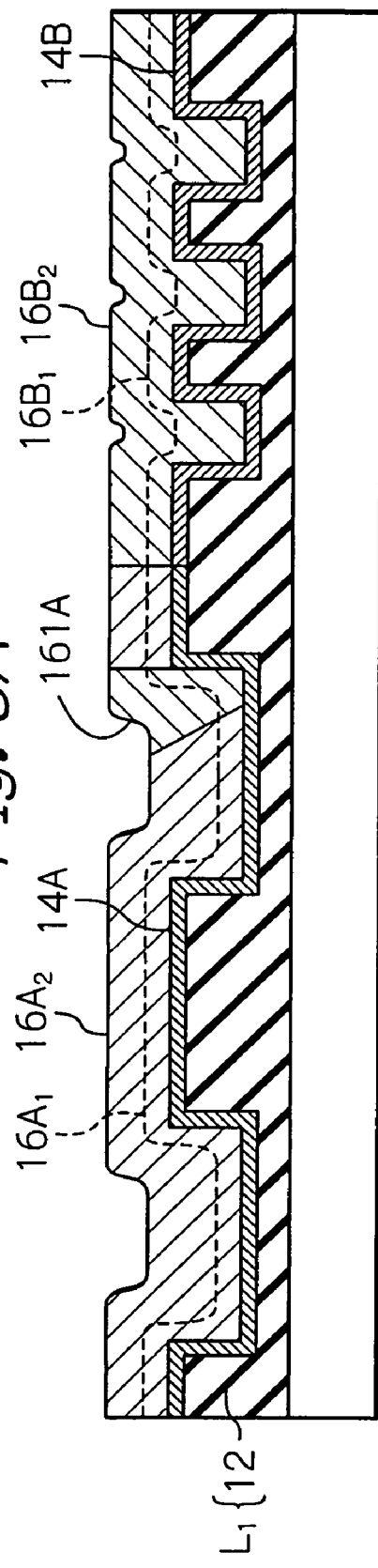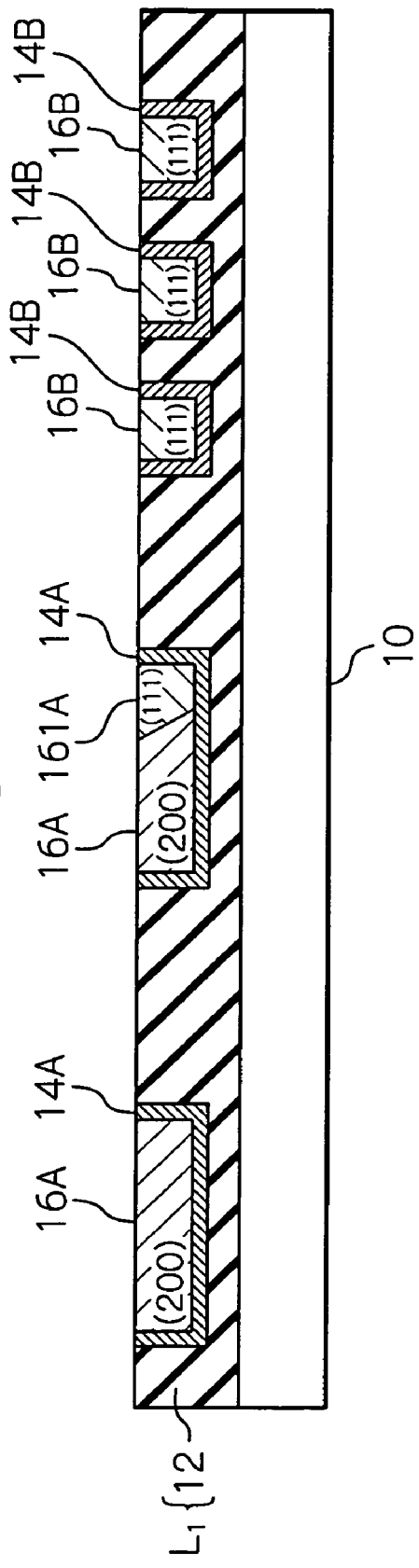

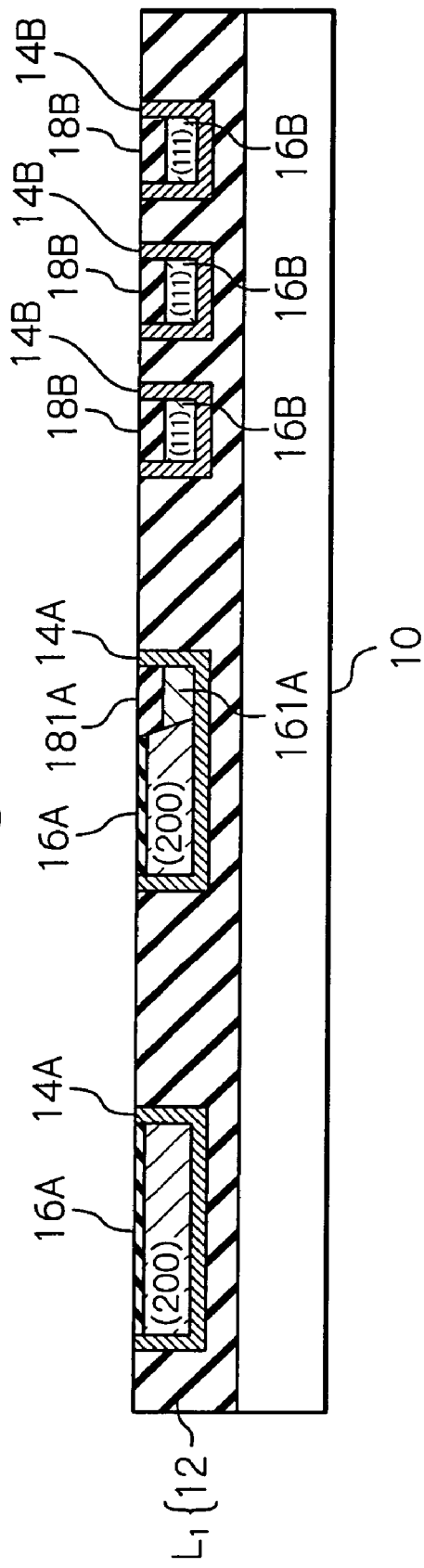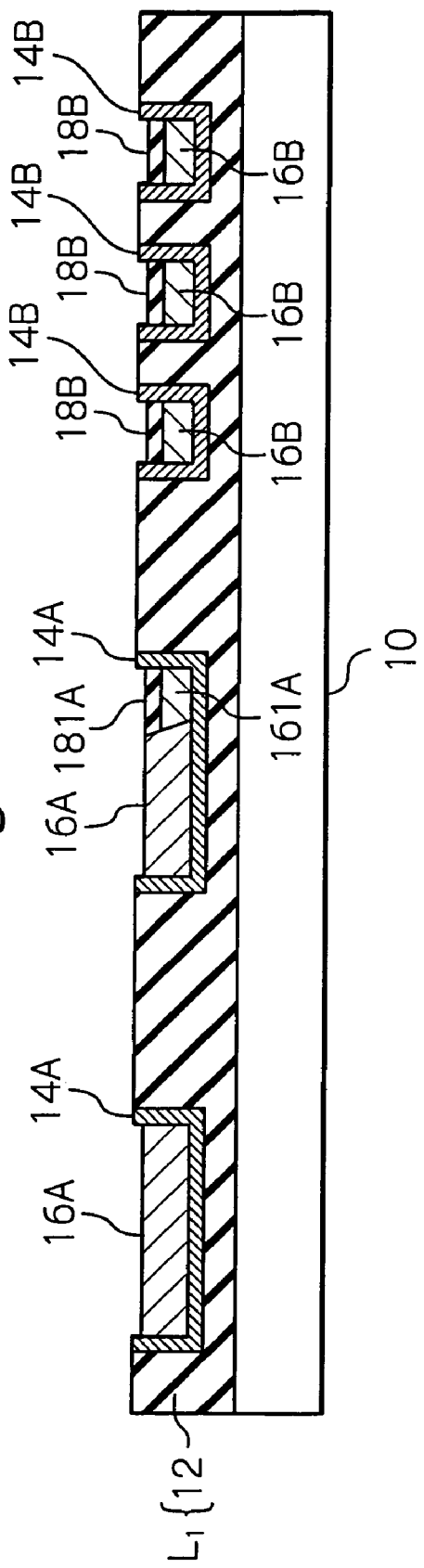

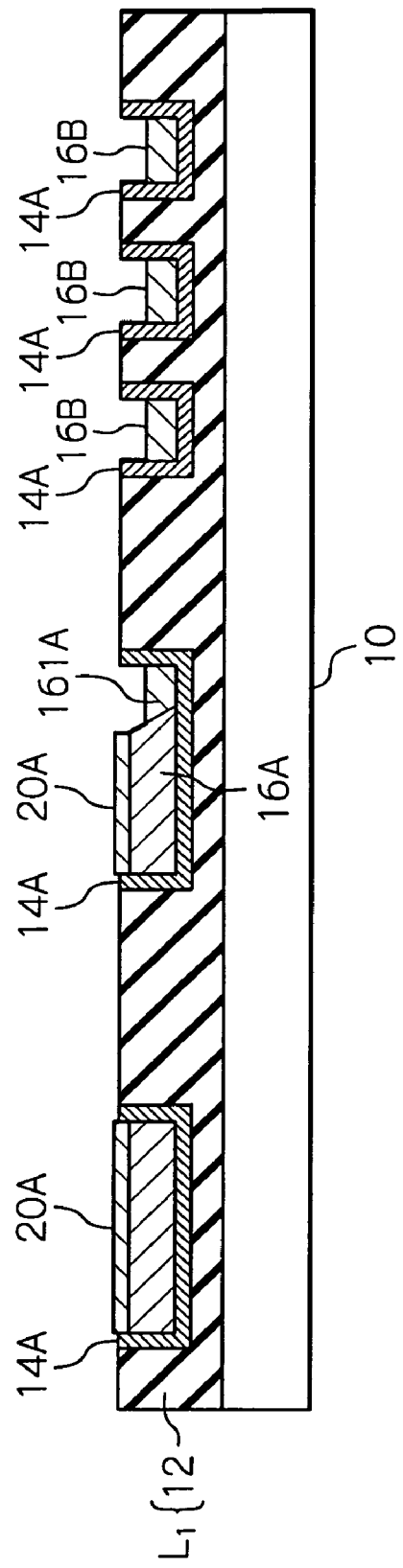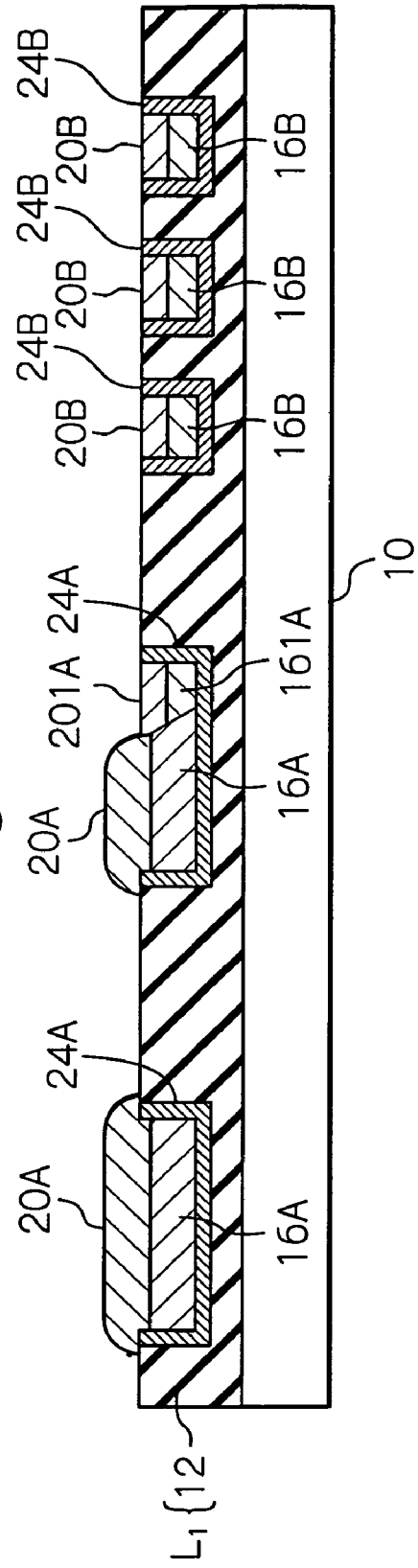

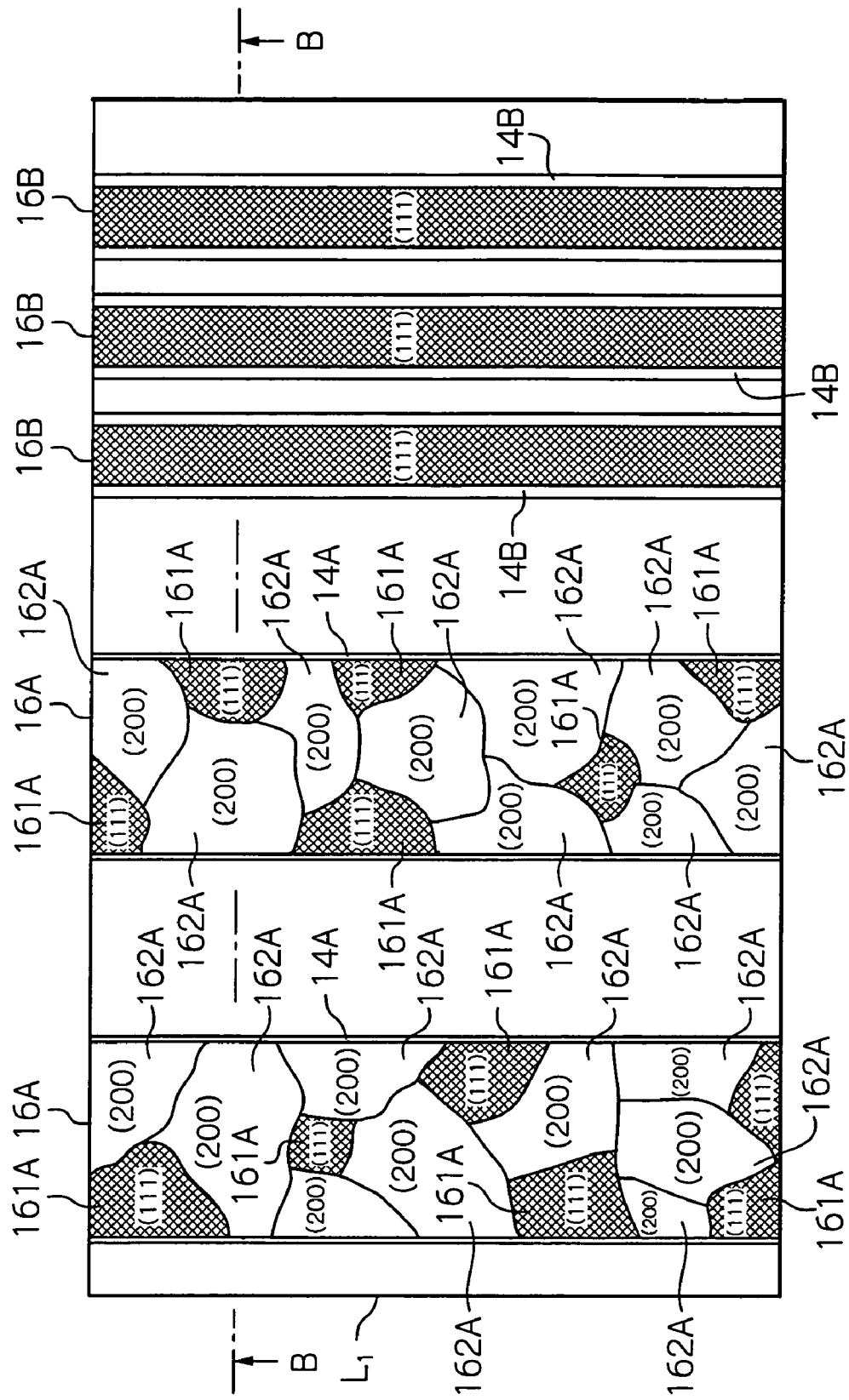

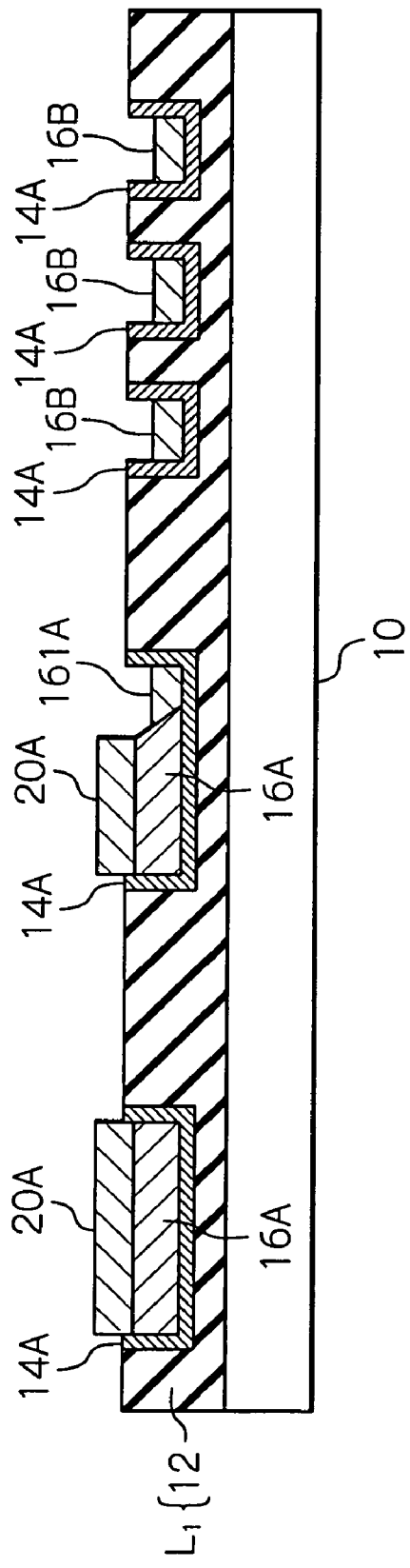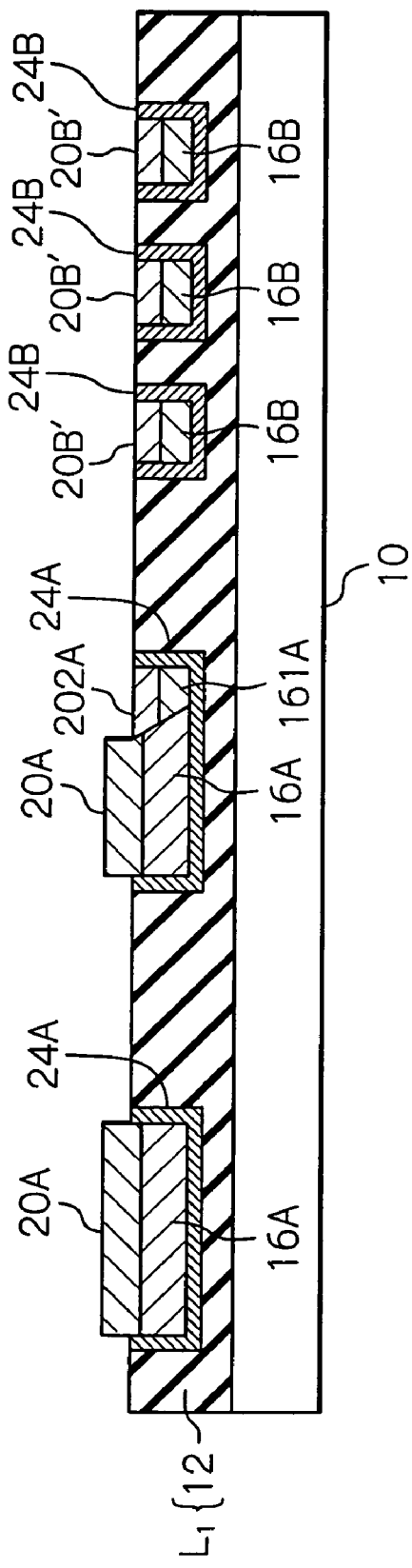

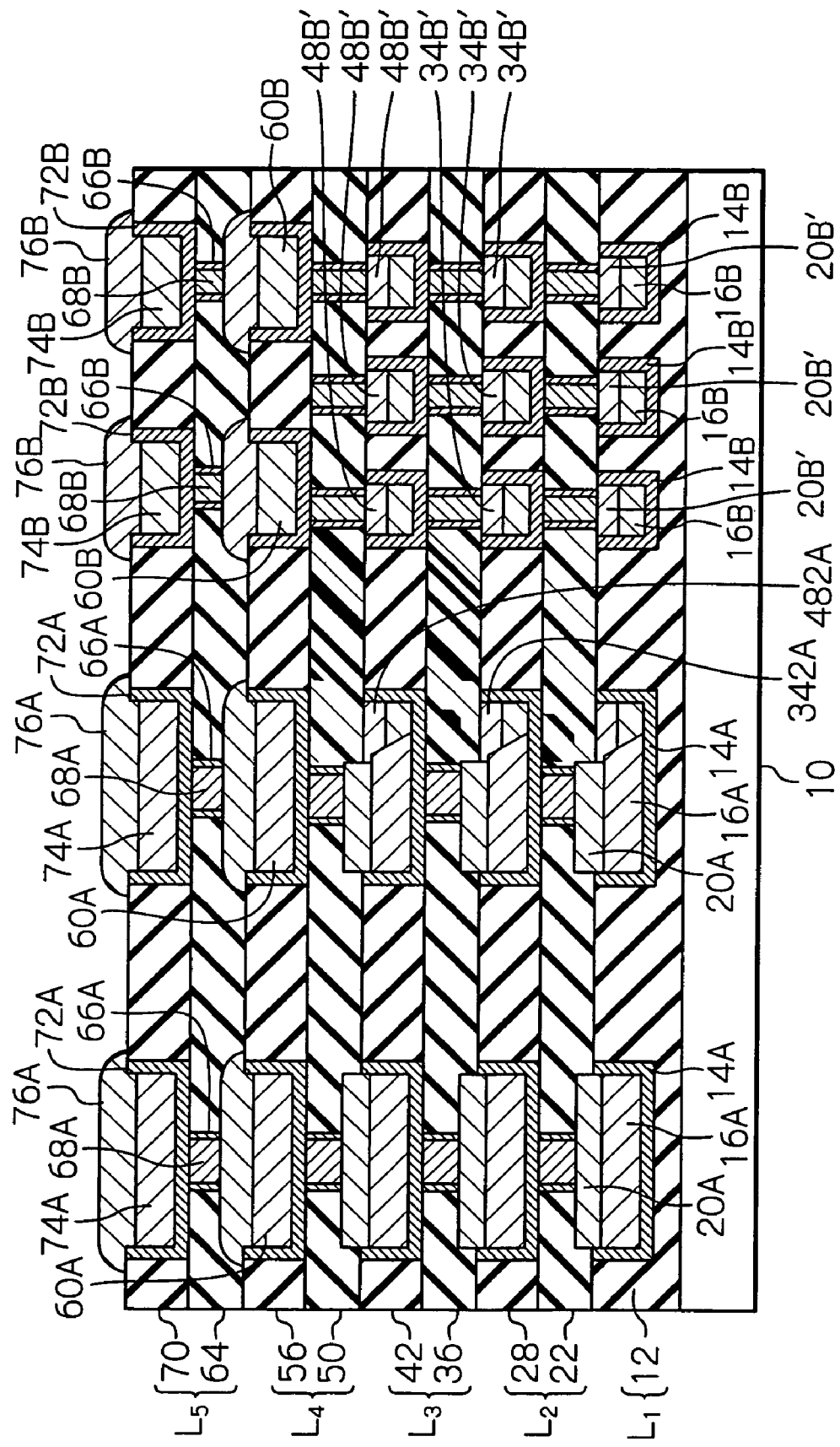

SEMICONDUCTOR DEVICE FEATURING COPPER WIRING LAYERS OF DIFFERENT WIDTHS HAVING METAL CAPPING LAYERS OF DIFFERENT THICKNESS FORMED THEREON, AND METHOD FOR MANUFACTURING THE SAME

BACKGROUND OF THE INVENTION

1. Field of the Invention

The present invention relates to a semiconductor device which features copper wiring layers having metal capping layers formed thereon, and a method for manufacturing such a semiconductor device.

2. Description of the Related Art

In a process of production of semiconductor devices, semiconductor elements, such as transistors, resistors, capacitors and so on, are produced in a semiconductor substrate, and then a multi-layered wiring structure is formed on the semiconductor substrate. The multi-layered wiring structure includes a local multi-layered wiring section formed on the semiconductor substrate, and a global multi-layered wiring section formed on the local multi-layered wiring section.

The local multi-layered wiring section includes a plurality of insulating interlayers, a plurality of wiring pattern layers each formed on one of the insulating interlayers, a plurality of groups of via plugs each group formed in one of the insulating interlayers to establish electrical connections between opposing ones of the two wiring pattern layers. The wiring pattern layers serve as power supply lines, ground lines and signal lines.

Usually, the power supply lines and the ground lines are arranged in parallel at a given pitch in a power/ground line area defined on the insulating interlayers, and the signal lines are arranged in parallel at a given pitch in a signal line area defined on the corresponding insulating interlayers. The power supply lines and the ground lines are wider than the signal lines, and a space or pitch between two adjacent ones of the power/ground lines is larger than a space or pitch between two adjacent ones of the signal lines.

The global multi-layered wiring section is constituted in substantially the same manner as the local multi-layered wiring section, but the power/ground lines and signal lines in the global multi-layered wiring section are wider than those of the local multi-layered wiring section.

With the advance of miniaturization and integration of semiconductor devices, the wiring pattern layers become smaller, and thus the signal lines become narrower, resulting in delay of signal propagation in the narrowed wiring lines, due to a parasitic resistance of the signal lines themselves and a parasitic capacitance involved in the signal lines.

In order to improve the delay of the signal propagation, it has been proposed that copper be used for the wiring pattern layers as a substitute for aluminum, which is conventionally used for the wiring pattern layers. Also, the use of copper is advantageous in that the copper wiring pattern layers exhibit a superior anti-electromigration (EM) characteristic in comparison with that of the aluminum wiring pattern layers.

Nevertheless, when the miniaturization and integration of semiconductor devices is further advanced, the copper wiring pattern layers become increasingly smaller, so that a non-neglectable electromigration may occur in the copper wiring pattern layers. Also, as a problem peculiar to fine copper wiring layers, there is a stress induced voiding (SIV) problem, in which voids are produced in roots of the via plugs formed in the insulating interlayers, due to thermal stresses to which the copper wiring layers are subjected. Namely, in the copper wiring layers, it is necessary to take an anti-SIV characteristic into consideration.

In order to improve both the anti-electromigration characteristic and the anti-SIV characteristic in the copper wiring layers, it has been proposed that surfaces of the copper wiring layers are coated with metal capping layers which are composed of CoWP, CoSnP or CoP, as disclosed in, for example, JP-2003-505882-A. However, when the metal capping layers are formed on the fine copper wiring layers, featuring the minimum line width, included in the local multi-layered wiring section, the formation of the metal capping layers on the fine copper wiring layers is liable to be exceeded, resulting in occurrence of short circuits between the fine copper wiring layers, as stated in detail hereinafter.

SUMMARY OF THE INVENTION

Therefore, an object of the present invention is to provide a semiconductor device which is constituted such that not only can both an anti-electromigration characteristic and an anti-SIV characteristic be considerably improved, but also it is possible to prevent occurrence of short circuits between fine copper wiring layers.

Another object of the present invention is to provide a method for manufacturing such a semiconductor device.

In accordance with a first aspect of the present invention, there is provided a semiconductor device which includes a first wiring layer which is substantially composed of copper, a second wiring layer which is substantially composed of copper, a first metal capping layer formed on the first wiring layer, and a second metal capping layer formed on the second wiring layer. A thickness of the first metal capping layer is thicker than that of the second metal copping layer.

Each of the first and second metal capping layers may be composed of one selected from the group consisting of CoWP alloy, CoP alloy layer, CoWB alloy and CoSnP alloy.

The semiconductor device may further comprises a multi-layered wiring structure. In this case, the first and second wiring layers may be formed in an insulating interlayer included in the multi-layered wiring structure.

The insulating interlayer may include a first barrier layer containing tantalum nitride as a main component and formed between the first wiring layer and the insulating interlayer, and a second barrier layer containing tantalum as a main component and formed between the second wiring layer and the insulating interlayer. A nitrogen density of the first barrier layer being larger than that of the second barrier layer.

The first wiring layer may include a plurality of crystallized copper grains, crystal faces (200) of which appear on a surface of the first wiring layer, and the first metal capping layer may be formed on the surface of the first wiring layer which is featured by the crystal faces (200). Also, the second wiring layer may include a plurality of second crystallized copper grains, crystal faces (111) of which appear on a surface of the second wiring layers, and the second capping layer may be formed on the surface of the second wiring layer which is featured by the crystal faces (111).

The first wiring layer may include a plurality of crystallized copper grains, crystal faces (200) of which appear on a surface of the first wiring layer, and a plurality of crystallized copper regions each having a plurality of crystallized grains, crystal faces (111) of which appear on a surface of the first wiring layer. In this case, a metal capping region is formed on each of the crystallized copper regions which is featured by the crystal faces (111), with the metal capping regions forming a part of the first metal capping layer. An thickness of each of the metal capping layers is substantially equivalent to that of the second metal capping layer.

The second wiring layer may include a plurality of second crystallized copper grains, crystal faces (111) of which appear on a surface of the second wiring layers, and the second capping layer may be formed on the surface of the second wiring layer which is featured by the crystal faces (111).

The formation of the first metal capping layer on the first wiring layer may be partially carried out, and a copper silicide layer may be formed on the remaining area on the first wiring layer from which the formation of the first metal capping layer is excluded. In this case, the second metal capping layer is also formed as a copper silicide layer.

In accordance with a second aspect of the present invention, there is provided a semiconductor device which comprises a plurality of at least two first wiring layers which are substantially composed of copper, and which are arranged so as to be apart from each other at a first pitch, a plurality of at least two second wiring layers which are substantially composed of copper, and which are arranged so as to be apart from each other at a second pitch narrower than the first pitch, a plurality of first metal capping layers, each of which is formed on one of the first wiring layers, and a plurality of second metal capping layers, each of which is formed on one of the second wiring layers. A thickness of the first metal capping layers is thicker than that of the second metal copping layer.

In the second aspect of the present invention, the semiconductor device may further comprises a multi-layered wiring structure, and the first wiring layers and the second wiring layers may be formed in an insulating interlayer included in the multi-layered wiring structure. Optionally, the first wiring layers may be formed in an insulating interlayer included in the multi-layered wiring structure, the second wiring layers may be formed in another insulating interlayer included in the multi-layered wiring structure.

In accordance with a third aspect of the present invention, there is provided a method for manufacturing a semiconductor device, which comprises: a first step of forming a first wiring layer and a second wiring layer which are substantially composed of copper, a width of the first wiring layer is wider than that of the second wiring layer; and a second step of forming a first metal capping layer and a second capping layer on the respective first and second wiring layers, the formation of the second metal capping layer is carried out at a smaller time than a time at which the formation of the first metal capping layer is carried out.

The first step may be executed such that the formation of the second metal capping layer is started later after a starting of the formation of the first metal capping layer, and such that both the formations of the first and second metal capping layers end at substantially a same time.

The first step may include a step of forming a first copper oxide layer and a second copper oxide layer on the respective first and second wiring layers. Also, the second step may include: a step of immersing the semiconductor device in a plating solution containing a copper oxide removal agent for removing the first and second copper oxide layers from the first and second wiring layers; a step of removing the first and second copper oxide layers with the copper oxide removal agent; and a step of carrying out both the formations of the first and second metal capping layers by the plating solution after the removals of the first and second copper oxide layers. In this case, a thickness of the first copper oxide layer is thinner than that of the second copper oxide layer.

On the other hand, the first step may include: a step of forming an insulating interlayer; a step of forming a first trench and a second trench in the insulating interlayer, the second trench being narrower than the first trench; a step of forming a first barrier layer containing tantalum nitride as a main component and a second barrier layer containing tantalum as a main component in the respective first and second trenches; a step of carrying out both the formations of the first and second wiring layers on the respective first and second barrier layers.

In accordance with a fourth aspect of the present invention, there is provided a method for manufacturing a semiconductor device, which comprises: a first step of forming a first wiring layer and a second wiring layer which are substantially composed of copper, a width of the first wiring layer is wider than that of the second wiring layer; a second step of forming a metal capping layer a partial area of a surface of the first wiring layer; and a third step of forming a copper silicide layer on a remaining area of the surface of the first wiring layer.

In the fourth aspect of the present invention, the third step may include a step of forming a copper silicide layer on a surface of the second wiring layer.

Also, in the fourth aspect of the present invention, the first wiring layer may include a plurality of crystallized copper grains, crystal faces (200) of which appear on the partial area of the surface of the first wiring layer, and a plurality of crystallized copper regions each having a plurality of crystallized grains, crystal faces (111) of which appear on the remaining area of the surface of the first wiring layer.

BRIEF DESCRIPTION OF THE DRAWINGS

The above object and other objects will be more clearly understood from the description set forth below, with reference to the accompanying drawings, wherein:

FIGS. 1A to 1E are cross-sectional views for explaining a prior art method for manufacturing a semiconductor device;

FIGS. 3A to 3G are cross-sectional views for explaining a second embodiment of the method for manufacturing a semiconductor device according to the present invention;

FIG. 4 is a plan view of the semiconductor device of FIG. 3B; and

FIGS. 5A, 5B and 5C are cross-sectional views for explaining a third embodiment of the method for manufacturing a semiconductor device according to the present invention.

DESCRIPTION OF THE PREFERRED EMBODIMENTS

Figure 1E:
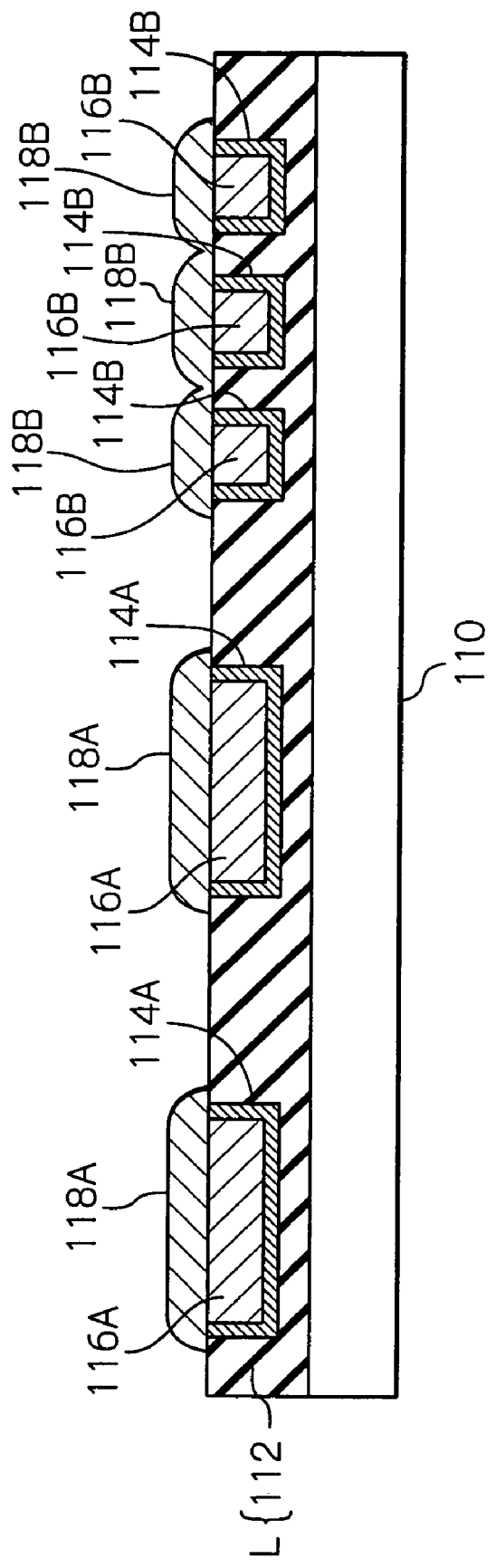

Before a description of the preferred embodiments of the present invention, for better understanding of the present invention, a prior art method for manufacturing a semiconductor device will be now explained with reference to FIGS. 1A to 1E.

First, referring to FIG. 1A, reference 110 indicates a semiconductor substrate, which may be formed as a silicon substrate. Although not shown in FIG. 1A, various semiconductor elements, such as transistors, resistors, capacitors and so on, are formed in advance in the semiconductor substrate 110, using various well-known processes.

After the formation of the semiconductor elements in the semiconductor substrate 110 is completed, an insulating layer 112 (i.e., an insulating interlayer L) is formed as a silicon dioxide layer on the semiconductor substrate 110 by a suitable chemical vapor deposition (CVD) process, and a plurality of wide trenches 112A and a plurality of narrow trenches 112B are formed in the insulating interlayer L, using a photolithography and etching process. The wide trenches 112A are arranged at a given pitch, and the narrow trenches 112B are arranged at a smaller pitch than that of the wide trenches 113A.

Next, referring to FIG. 1B, a metal barrier layer 114 is formed over a surface of the insulating interlayer 12 having the wide trenches 112A and the narrow trenches 112B formed therein, by using a sputtering process. In the sputtering process, nitrogen (N) gas is used as an ambient gas, tantalum (Ta) is used as a target metal, and a negative bias voltage is applied to the semiconductor substrate 110. During the sputtering process, the nitrogen gas is ionized to thereby produce nitrogen ions ($N^+$), and the nitrogen ions $N^+$ are electrically attracted to the semiconductor substrate 110. Thus, the metal barrier layer 114 is formed as an amorphous tantalum nitride (TaN) layer.

Next, referring to FIG. 1C, a copper (Cu) seed layer (not shown) is formed on the TaN barrier layer 114 by using a sputtering process. Then, a copper electroplating process, in which the Cu seed layer serves as a cathode electrode, is carried out so that a copper (Cu) layer is grown on the Cu seed layer to thereby obtain a Cu layer 116 including the Cu seed layer. At this time, the Cu layer 116 is formed as an amorphous layer, because the TaN barrier layer 114 is amorphous. The copper electroplating process is continued until the wide trenches 112A and the narrow trenches 112B are completely filled with the Cu layer 116.

Note, the TaN barrier layers 114 prevent diffusion of copper atoms (Cu) from the Cu layer 116 into the insulating interlayer 12.

After the copper electroplating process is completed, both the TaN barrier layer 114 and the Cu layer 116 are subjected to an annealing process for crystallization at a temperature of at least 150° C. over a period of 30 min.

Next, referring to FIG. 1D, by using a chemical mechanical polishing (CMP) process, the redundant metals (Cu, TaN) are removed from both the crystallized TaN barrier layer 114 and the crystallized Cu layer 116. As a result, wide copper (Cu) wiring layers 116A are formed in the respective wide trenches 112A, and are surrounded by respective TaN barrier layers 114A. Similarly, narrow copper (Cu) wiring layers 116B are formed in the respective trenches 112B, and are surrounded by respective TaN barrier layers 114B.

Note, each of the wide wiring layers 116A serves as either a power supply line or a ground line, and each of the narrow Cu wiring layers 116B serves as a signal line.

Next, referring to FIG. 1E, a CoWP electroplating process is carried out so that a CoWP alloy layer 118A is formed as a metal capping layer on each of the wide Cu wiring layers 116A, and so that a CoWP alloy layer 118B is formed as a metal capping layer on each of the narrow Cu wiring layers 116B. Note, in the CoWP electroplating process, it is possible to use a CoWP electroplating solution which is composed of cobalt sulfate ($COSO_4$), boric acid ($H_3BO_3$), sodium hydrogen phosphate ($H_2PO_2$), sodium tungstate ($Na_2WO_4$) and so on.

In this prior art method as illustrated in FIGS. 1A to 1E, in order to sufficiently improve both an anti-electromigration characteristic and an anti-SIV characteristic in the wide Cu wiring layers 116A, it is necessary to give a predetermined thickness to the CoWP capping layers 118A. Nevertheless, when the predetermined thickness is given to the CoWP capping layers 118A, the CoWP capping layers 118B are excessively formed on the narrow wiring layers 116B, resulting in occurrence of short circuits between the narrow wiring layers 116B, as shown in FIG. 1E.

With reference to FIGS. 2A to 2O, a first embodiment of the method for manufacturing a semiconductor device according to the present invention is explained below.

First, referring to FIG. 2A, as a similar way to the case of FIG. 1A, reference 10 indicates a semiconductor substrate, which may be formed as a silicon substrate. Also, various semiconductor elements (not shown), such as transistors, resistors, capacitors and so on, are produced in advance in the semiconductor substrate 10, using various well-known processes.

After the production of the semiconductor elements in the semiconductor substrate 10 is completed, an insulating layer 12 (i.e., an insulating interlayer $L_1$) is formed as a silicon dioxide layer on the semiconductor substrate 10 by a suitable CVD process, and a plurality of wide trenches 12A and a plurality of narrow trenches 12B are formed in the insulating interlayer 12, using a photolithography and etching process. The wide trenches 12A are arranged at a given pitch, and the narrow trenches 12B are arranged at a smaller pitch than that of the wide trenches 12A.

Next, referring to FIG. 2B, by using a suitable sputtering process, a metal barrier layer 14A is formed on a surface area of the insulating interlayer 12 in which the wide trenches 12A are formed, and a metal barrier layer 14B is formed on another surface area of the insulating interlayer 12 in which the narrow trenches 12B are formed. The metal barrier layer 14A is formed as a tantalum nitride (TaN) layer containing TaN as a main component, and the metal barrier layer 14B is formed as a tantalum (Ta) layer, a major part of which is composed of tantalum (Ta). It is possible to carry out the formation of both the TaN barrier layer 14A and the Ta barrier layer 14B in one process.

In particular, in the sputtering process, nitrogen (N) gas is used as an ambient gas, and tantalum (Ta) is used as a target metal. During the sputtering process, the nitrogen gas is ionized to thereby produce nitrogen ions ($N^+$). Usually, a negative bias voltage is applied to the semiconductor substrate 10 to thereby electrically attract the nitrogen ions $N^+$ to the semiconductor substrate 10, as stated with reference to FIG. 1B.

However, in this sputtering process, no negative bias voltage is applied to the semiconductor substrate 10. Thus, the nitrogen ions ($N^+$) can relatively easily penetrate into the wide trenches 14A, but there is a tendency to suppress penetration of the nitrogen ions ($N^+$) into the narrow trenches 14B. As a result, the main component of the metal barrier layer 14A in the wide trenches 12A is tantalum nitride (TaN), and the major part of the metal barrier layer 14B in the narrow trenches 12B is tantalum (Ta).

Also, the metal barrier layer 14A is formed as a semi-amorphous layer in which TaN is amorphous, and Ta is crystallized, and crystal faces (111) of the crystallized Ta appear on a plane parallel to the surface of the semiconductor substrate 10. On the other hand, the metal barrier layer 14B is formed as a crystallized layer in which crystal faces (111) of the crystallized Ta barrier layer 14B appear on a plane parallel to the surface of the semiconductor substrate 10.

Next, referring to FIG. 2C, a copper (Cu) seed layer (not shown) is formed on both the TaN barrier layer 14A and the Ta barrier layer 14B by using a sputtering process. Then, a first copper electroplating process, in which the Cu seed layer serves as a cathode electrode, is carried out over a relatively long time period at a relatively small current value so that both copper (Cu) layers are slowly grown on the Cu seed layer above the respective TaN and Ta barrier layers 14A and 14B to obtain Cu layers $16A_1$ and $16B_1$ including the Cu seed layer.

At this time, although the metal (TaN) barrier layer 14A is formed as the semi-amorphous layer, the Cu layer $16A_1$ can be formed as an amorphous layer by suitably regulating the formation of the Cu seed layer (not shown). On the other hand, the Cu layer $16B_1$ is formed as a crystallized layer, due to the crystallization of the metal (Ta) barrier layer 14B. Note, similar to the crystallized Ta barrier layer 14B, crystal faces (111) of the crystallized Cu layer $16B_1$ appear on the plane parallel to the surface of the semiconductor substrate 10.

The first copper electroplating process is continued until the narrow trenches 12B are completely filled with the Cu layer $16B_1$, with the wide trenches 12A being partially filled with the Cu layer $16A_1$. Also, both the Cu layers $16A_1$ and $16B_1$ contain a relatively large amount of impurities, included in an electrolyte solution used in the first electroplating process, due to the slow growth rate of the both the Cu layers $16A_1$ and $16B_1$.

Note, the metal barrier (TaN, Ta) layers 14A and 14B prevent diffusion of copper atoms (Cu) from the Cu layers $16A_1$ and $16B_1$ into the insulating interlayer 12.

Next, referring to FIG. 2D, a second copper electroplating process is carried out over a relatively short time period at a relatively large current value, so that both copper (Cu) layers $16A_2$ and $16B_2$ are rapidly grown on the respective Cu layers $16A_1$ and $16B_1$. The second copper electroplating process is continued until the wide trenches 12A are completely filled with the Cu layer $16A_2$.

Note, in reality, the first and second copper electroplating processes can be carried out in one process by switching a current value from the small current value into the large current value.

Similar to the Cu layer $16A_1$, the Cu layer $16A_2$ is formed as an amorphous layer. Also, similar to the Cu layer $16B_1$, the Cu layer $16B_2$ is formed as a crystallized layer, and crystal faces (111) of the crystallized Cu layer $16B_2$ appear on the plane parallel to the surface of the semiconductor substrate 10. Both the Cu layers $16A_2$ and $16B_2$ contain a relatively small amount of impurities included in the electrolyte solution due to the rapid growth rate of both the Cu layers $16A_2$ and $16B_2$.

Note, in the first and second copper electroplating processes of FIGS. 2C and 2D, when a product of a current value and its current supplying time is defined as an integration value, the integration value in the second copper electroplating process of FIG. 2D is larger than the integration value in the first copper electroplating process of FIG. 2C.

After the second copper electroplating process is completed, the TaN barrier layer 14A and both the Cu layers $16A_1$ and $16A_2$ are subjected to an annealing process for crystallization at a temperature of at least 150° C. (e.g. 350° C.) over a period of 30 min.

In this annealing process, the amorphous Cu layers $16A_1$ and $16A_2$, with which the wide trenches 14A are filled, are crystallized so as to have a large grain size on the order of several microns (μm) because the Cu layer $16A_2$ contains the relatively small amount of impurities due to the rapid growth rate of the Cu layer $16A_2$. Also, when the crystallization of the amorphous Cu layers $16A_1$ and $16A_2$ is carried out by the annealing process, the crystallized copper layer has a tendency for the crystal faces (200) of the crystallized Cu layers $16A_1$ and $16A_2$ to appear on the plane parallel to the surface of the semiconductor substrate 10.

On the other hand, the crystallized Cu layer $16B_1$, with which the narrow trenches 14B is filled, features a considerably fine grain size on the order of several tens of nanometers (nm), because the Cu layer $16B_1$ contains the relatively large amount of impurities due to the slow growth rate of the Cu layer $16B_1$. Note, as stated above, the crystal faces (111) of the crystallized Cu layer $16B_1$ appear on the plane parallel to the surface of the semiconductor substrate 10.

Next, referring to FIG. 2E, by using a chemical mechanical polishing (CMP) process, the redundant metals (Cu, TaN, Ta) are removed from the Cu layers $16A_2$ and $16B_2$, the Cu layers $16A_1$ and $16B_1$, the TaN barrier layers 14A and the Ta barrier layers 14B. As a result, wide copper (Cu) wiring layers 16A are formed in the respective wide trenches 12A, and are surrounded by respective metal barrier layers 14A. Similarly, narrow copper (Cu) wiring layers 16B are formed in the respective trenches 12B, and are surrounded by respective metal barrier layers 14B.

Note, in FIG. 2E, the crystal faces (200) appearing on each of the polished surfaces of the wide Cu wiring layers 16A are represented by reference (200), and the crystal faces (111) appearing on each of the polished surfaces of the Cu wiring layers 16B are represented by reference (111).

Next, referring to FIG. 2F, by using an oxidization process, a cupric oxide (CuO) layer 18A is formed in each of the surfaces of the wide Cu wiring layers 16A, and a cupric oxide (CuO) layer 18B is formed in each of the surfaces of the narrow Cu wiring layers 16B. The oxidization process can be carried out by exposing the Cu wiring layers 16A and 16B to an atmosphere, because copper (Cu) is easily oxidized with oxygen included in the atmosphere. Otherwise, during the execution of the CMP process, the oxidization process may be positively carried out by adding hydrogen peroxide ($H_2O_2$) to an abrasive slurry used in the CMP process.

In either event, the cupric oxide (CuO) layers 18A features a thickness which is smaller than that of the cupric oxide (CuO) layers 18B, in that the wide Cu wiring layers 16A have a large grain size on the order of several microns (μm), whereas the narrow Cu wiring layers 16B have a fine grain size on the order of several tens of nanometers (nm).

In particular, the wide Cu wiring layers 16A exhibit a low grain boundary density due to the large grain size thereof, whereas the narrow Cu wiring layers 16B exhibit a high grain boundary density due to the fine grain size thereof. Thus, during the oxidization process, oxygen can more deeply penetrate into the narrow Cu wiring layers 16B due to the high grain boundary density thereof, in comparison with the case of the wide Cu wiring layers 16A. As a result, the thickness of the cupric oxide (CuO) layers 18A is smaller than that of the cupric oxide (CuO) layers 18B.

After the oxidization process is completed, each of the cupric oxide (CuO) layers 18A and 18B is reformed as a cuprite oxide ($Cu_2O$) layer by treating the cupric oxide (CuO) layers 18A and 18B with an aqueous washing solution exhibiting a redox (oxidization-reduction) potential falling within a range from 0 to 0.2 (V vs NHE) and a pH falling within a range from 7 to 10.

Note, as stated hereinafter, the reformed cuprite oxide ($Cu_2O$) layers 18A and 18B are chemically removed later, and it is possible to more easily carry out the removal of the cuprite oxide ($Cu_2O$) layers 18A and 18B in comparison with the removal of the cupric oxide (CuO) layers.

After the reformation of the cupric oxide (CuO) layers 18A and 18B is completed, an anti-oxidizing layer (not shown) may be formed over the surfaces of the wide Cu wiring layers 16A and the narrow Cu wiring layer 16B, if necessary. For example, it is possible to use a benzotriazole (BTA) layer as the anti-oxidizing layer, which is obtained by treating the wide Cu wiring layers 16A and the narrow Cu wiring layers 16B with a BTA solution.

In either event, the semiconductor substrate 10 having the wide Cu wiring layers 16A and the narrow Cu wiring layers 16B is immersed in a CoWP electroplating solution containing a $Cu_2O$ removal agent for removing the cuprite oxide ($Cu_2O$) layer 18A and 18B from the wide Cu wiring layers 16A and the narrow Cu wiring layers 16B. At this time, if the semiconductor substrate 10 is provided with the aforesaid anti-oxidizing layer, the immersion of the semiconductor substrate 10 into the CoWP electroplating solution containing the $Cu_2O$ removal agent is carried out after the anti-oxidizing layer is eliminated from the surfaces of the wide Cu wiring layers 16A and the narrow Cu wiring layers 16B.

Note, the CoWP electroplating solution may be composed of cobalt sulfate ($CoSO_4$), boric acid ($H_3BO_3$), sodium hydrogen phosphate ($H_2PO_2$), sodium tungstate ($Na_2WO_4$) and so on, and sodium citrate ($C_6H_5Na_3O_7.2H_2O$) is added to the CoWP electroplating solution as the aforesaid $Cu_2O$ removal agent.

Next, referring to FIG. 2G, the $Cu_2O$ layers 18A of FIG. 2F are completely removed from the wide wiring layers 16A by the $Cu_2O$ removal agent ($C_6H_5Na_3O_7.2H_2O$) contained in the CoWP electroplating solution, but only a part of each of the $Cu_2O$ layers 18B is removed from the narrow wiring layers 16B, because the $Cu_2O$ layers 18B are thicker than the $Cu_2O$ layers 18A (see: FIG. 2F).

When the $Cu_2O$ layers 18A of FIG. 2F are completely removed from the wide wiring layers 16A, a CoWP electroplating process is started by supplying a current into the CoWP electroplating solution. At this time, the wide Cu wiring layers 16A are immediately subjected to the CoWP electroplating process, but the narrow Cu wiring layers 16B cannot be subjected to the CoWP electroplating process until the $Cu_2O$ layers 18B are completely removed from the narrow Cu wiring layers 16B.

Next, referring to FIG. 2H, a CoWP alloy layer 20A is formed as a metal capping layer on each of the wide Cu wiring layers 16A by the CoWP electroplating process while the $Cu_2O$ layers 18B is removed from the narrow Cu wiring layers 16B. After the removal of the $Cu_2O$ layers 18B is completed, the narrow Cu wiring layer 16B is subjected to the CoWP electroplating process.

Next, referring to FIG. 2I, the metal (CoWP) capping layers 20A are further grown, and a CoWP alloy layer 20B is formed as a metal capping layer on each of the narrow Cu wiring layers 16B. When the $Cu_2O$ layers 18B of FIG. 2F are replaced with the metal (CoWP) capping layers 20B, the CoWP electroplating process is stopped. Thus, the metal capping layers 20A formed on the wide Cu wiring layers 16A have a larger thickness than that of the metal capping layers 20B formed on the narrow Cu wiring layers 16B. Namely, it is possible to suppress an excess formation of the metal capping layers 20B on the narrow Cu wiring layers 16B, resulting in prevention of occurrence of a short circuit between the narrow Cu wiring layers 16B.

Note, a difference in thickness between the metal capping layers 20A and the metal capping layers 20B is at least 100 Å, and should be at most 300 Å so that a flatness of the insulating interlayer 12 cannot be subjected to damages.

Next, referring to FIG. 2J, an insulating layer 22 is formed as a silicon dioxide layer over the insulating interlayer $L_1$ by using a CVD process. Then, via holes 23A are perforated in the insulating interlayer 22 so that the respective metal capping layers 20A are partially exposed to the exterior, and via holes 23B are perforated in the insulating interlayer 22 so that the respective metal capping layers 20B are partially exposed to the exterior. Note, the formation of the via holes 23A and 23B may be carried out by using a photolithography and etching process.

Next, referring to FIG. 2K, a metal barrier layer 24A is formed on an inner peripheral side wall of each of the via holes 23A (see: FIG. 2J), and a metal barrier layer 24B is formed on an inner peripheral side wall of each of the via holes 23B (see: FIG. 2J). Note, the formation of the metal barrier layers 24A and 24B may be carried out by using a sputtering process, and each of the metal barrier layers 26A and 26B may be formed as a TaN or Ta layer.

Then, a copper (Cu) via plug 26A is formed in each of the via holes 26A (see: FIG. 2J) so as to be surrounded by the corresponding metal barrier layer 24A, to thereby prevent diffusion of copper atoms (Cu) from the Cu via plugs 26A into the insulating layer 22, and is connected to the corresponding metal capping layer 20A. Similarly, a copper (Cu) via plug 26B is formed in each of the via holes 26B (see: FIG. 2J) so as to be surrounded by the corresponding metal barrier layer 24B, to thereby prevent diffusion of copper atoms (Cu) from the Cu via plugs 26V into the insulating layer 22, and is connected to the corresponding metal capping layer 20B. Note, the formation of the Cu via plugs 26A and 26B may be carried out by using either a sputtering process or a copper (Cu) electroplating process.

Next, referring to FIG. 2L, an insulating layer 28 is further formed as a silicon dioxide layer on the insulating layer 22, the metal barrier layers 24A and 24B, and the Cu via plugs 26A and 26B, by using a CVD process. Both the insulating layers 22 and 28 form an insulating interlayer $L_2$. Provided in the insulating layer 28 are metal (TaN, Ta) barrier layers 30A and 30B, wide and narrow Cu wiring layers 32A and 32B, and metal CoWP capping layers 34A and 34B, which correspond to the respective metal (TaN, Ta) barrier layers 14A and 14B, wide and narrow Cu wiring layers 16A and 16B, and metal (CoWP) capping layers 20A and 20B of the insulating interlayer 12 ($L_1$), and which are formed in the same manner as explained with reference to FIGS. 2A to 2I.

Thus, it is possible to suppress an excess formation of the metal capping layers 34B on the narrow Cu wiring layers 32B, resulting in prevention of occurrence of a short circuit between the narrow Cu wiring layers 32B.

Note, each of the Cu via plugs 26A establishes an electrical connection between the corresponding wide Cu wiring layer 32A and the corresponding wide Cu wiring layer 16A, and each of the Cu via plugs 26B establishes an electrical connection between the corresponding narrow Cu wiring layer 32B and the corresponding narrow Cu wiring layer 16B.

Next, referring to FIG. 2M, an insulating interlayer $L_3$ is formed on the insulating interlayer $L_2$ in the same manner as the insulating interlayer $L_2$. In particular, an insulating layer 36 of the insulating interlayer $L_3$ is formed as a silicon dioxide layer over the insulating interlayer $L_2$ by using a CVD process, and includes metal (TaN or Ta) barrier layers 38A and 38B and copper (Cu) via plugs 40A and 40B, which correspond to the respective metal barrier layers 24A and 24B and Cu via plugs 26A and 26B of the insulating interlayer $L_2$, and which are formed in the same manner as explained with reference to FIGS. 2J and 2K.

Further, an insulating layer 42 of the insulating interlayer $L_3$ is formed as a silicon dioxide layer on the insulating layer 36 by using a CVD process, and includes metal (TaN, Ta) barrier layers 44A and 44B, wide and narrow Cu wiring layers 46A and 46B, and CoWP capping layers 48A and 48B, which correspond to the respective metal (TaN, Ta) barrier layers 14A and 14B, wide and narrow Cu wiring layers 16A and 16B, and metal (CoWP) capping layers 20A and 20B of the insulating interlayer $L_1$, and which are formed in the same manner as explained with reference to FIGS. 2A to 2I.

Thus, similar to case of the insulating interlayer $L_2$, it is possible to suppress an excess formation of the metal capping layers 48B on the narrow Cu wiring layers 36B, resulting in prevention of occurrence of a short circuit between the narrow Cu wiring layers 36B.

Note, each of the Cu via plugs 40A establishes an electrical connection between the corresponding wide Cu wiring layer 46A and the corresponding wide Cu wiring layer 32A, and each of the Cu via plugs 40B establishes an electrical connection between the corresponding narrow Cu wiring layer 46B and the corresponding narrow Cu wiring layer 32B.

In FIG. 2M, the insulating interlayers $L_1$, $L_2$ and $L_3$ form a local multi-layered wiring section. In this local multi-layered wiring section, each of the wide Cu wiring layers 16A, 32B and 46B serves as either a power supply line or a ground line, and each of the narrow Cu wiring layers 16B, 32B and 46B serves as a signal line featuring the minimum line width.

Next, referring to FIG. 2N, an insulating layer 50 is formed as a silicon dioxide layer on the insulating interlayer $L_3$ by using a CVD process, and includes metal (TaN or Ta) barrier layers 52A and 52B and copper (Cu) via plugs 54A and 54B, which are formed in the same manner as explained with reference to FIGS. 2J and 2K.

Further, an insulating layer 56 is formed as a silicon dioxide layer over the insulating layer 50 having the metal barrier layers 52A and 52B and the Cu via plugs 54A and 54B, by using a CVD process. Both the insulating layers 50 and 56 form an insulating interlayer $L_4$. Provided in the insulating interlayer $L_4$ are metal (TaN, Ta) barrier layers 58A and 58B, wide and narrow Cu wiring layers 60A and 60B, and CoWP capping layers 62A and 62B which are formed in the conventional manner as explained with reference to FIGS. 1A to 1E.

Figure 2N:
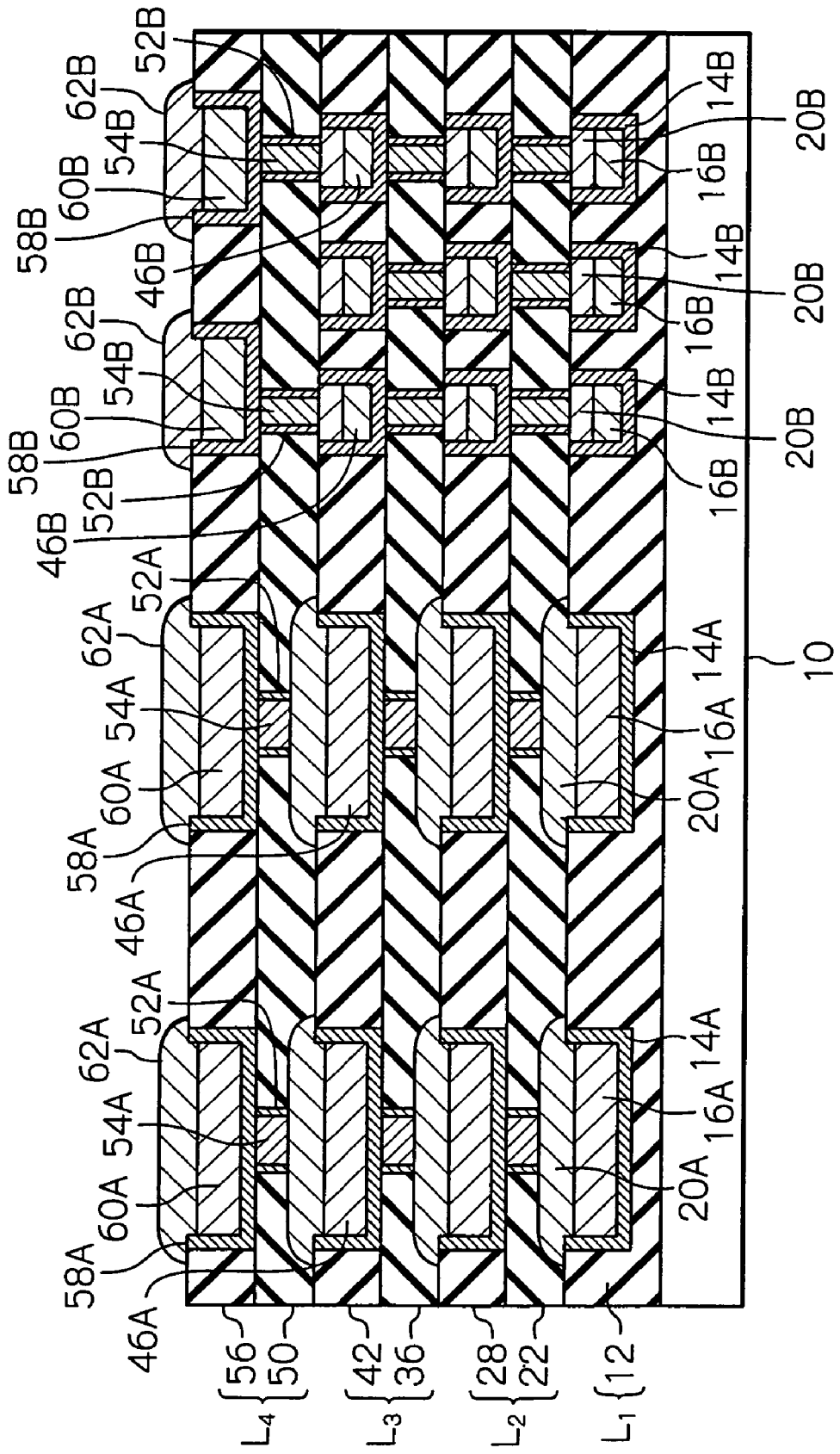
FIGS. 2A to 2O are cross-sectional views for explaining a first embodiment of the method for manufacturing a semiconductor device according to the present invention.

As shown in FIG. 2N, the narrow Cu wiring layers 60B formed in the insulating interlayer $L_4$ have a wider width than those of the narrow Cu wiring layers 16B, 32B and 46B, and are arranged so that a space between the narrow Cu wiring layers 60B becomes larger than the space between the adjacent two narrow Cu wiring layers (16B, 32B, 46B) formed in each of the insulating interlayers $L_1$, $L_2$ and $L_3$. Thus, the formation of the respective CoWP capping layers 62B on the narrow Cu wiring layers 60B cannot cause an occurrence of a short circuit between the narrow Cu wiring layers 60B.

Note, each of the Cu via plugs 54A establishes an electrical connection between the corresponding wide Cu wiring layer 60A and the corresponding wide Cu wiring layer 46A, and each of the Cu via plugs 54B establishes an electrical connection between the corresponding narrow Cu wiring layer 60B and the corresponding narrow Cu wiring layer 46B.

Next, referring to FIG. 2O, an insulating interlayer $L_5$ is formed over the insulating interlayer $L_4$ in the same manner as the insulating interlayer $L_4$. In particular, an insulating layer 64 is formed as a silicon dioxide layer on the insulating interlayer $L_4$ by using a CVD process. Formed in the insulating layer 64 are metal (TaN, Ta) barrier layers 66A and 66B and Cu via plugs 68A and 68B, which correspond to the respective metal barrier layers 52A and 52B and Cu via plugs 54A and 54B of the insulating interlayer $L_4$, and which are formed in the same manner as explained with reference to FIGS. 2J and 2K.

Further, an insulating layer 70 is formed as a silicon dioxide layer on the insulating layer 64 having the metal barrier layers 66A and 66B and the Cu via plugs 68A and 68B, by using a CVD process. Formed in the insulating layer 70 of the insulating interlayer $L_5$ are metal (TaN, Ta) barrier layers 72A and 72B, wide and narrow Cu wiring layers 74A and 74B, and CoWP capping layers 76A and 76B, which correspond to the respective metal (TaN, Ta) barrier layers 58A and 58B, wide and narrow Cu wiring layers 60A and 60B, and metal (CoWP) capping layers 62A and 62B of the insulating interlayer $L_4$, and which are formed in the insulating layer 70 in the conventional manner as explained with reference to FIGS. 1A to 1E.

Note, each of the Cu via plugs 68A establishes an electrical connection between the corresponding wide Cu wiring layer 74A and the corresponding wide Cu wiring layer 60A, and each of the Cu via plugs 68B establishes an electrical connection between the corresponding narrow Cu wiring layer 74B and the corresponding narrow Cu wiring layer 60B.

In FIG. 2O, the insulating interlayers $L_4$ and $L_5$ form a global multi-layered wiring section over the aforesaid local multi-layered wiring section ($L_1$, $L_2$ and $L_3$), and both the local and global multi-layered wiring sections defines a multi-layered wiring structure. In the global multi-layered wiring section, each of the wide Cu wiring layers 60A and 74A serves as either a power supply line or a ground line, and each of the narrow Cu wiring layers 60B and 74B serves as a signal line.

In short, according to the present invention, not only can both the anti-electromigration characteristic and the anti-SIV characteristic be considerably improved due to the formation of the respective metal capping layers 20A, 34A, 48A, 62A, 76A, 20B, 34A, 48A, 62A and 76A, but also it is possible to prevent the occurrence of short circuits between the narrow Cu wiring layers 16B, 32B and 46B featuring the minimum line width, by suppressing the excess formation of the metal capping layers 20B, 34B and 48B the narrow Cu wiring layers 16B, 32B and 46B.

With reference to FIGS. 3A to 3H, a second embodiment of the method for manufacturing a semiconductor device according to the present invention is explained below.

As stated with reference to FIG. 2B, in the aforesaid first embodiment, the metal barrier layer 14A is formed as the semi-amorphous layer in which tantalum nitride (TaN) is amorphous and tantalum (Ta) is crystallized. As a result, in FIGS. 2C and 2D, there may be a case where both the Cu layers $16A_1$ and $16A_2$ are formed as a semi-amorphous copper (Cu) layer in the wide trenches 12A. The second embodiment is directed to how the semi-amorphous copper (Cu) layer ($16A_1$ and $16A_2$) is processed.

Referring to FIG. 3A which corresponds to FIG. 2D, the semi-amorphous Cu layer ($16A_1$ and $16A_2$) includes a plurality of crystallized copper (Cu) regions, one of which is representatively indicated by reference 161A. Similar to the crystallized Cu layer $16B_1$, with which the narrow trenches 14B are filled, the crystallized Cu region 161A has a considerably fine size on the order of several tens of nanometers (nm), and crystal faces (111) of the crystallized Cu layer regions 161A appear on the plane parallel to the surface of the semiconductor substrate 10.

Similar to the aforesaid first embodiment, when the amorphous copper (Cu) of the semi-amorphous Cu layer ($16A_1$ and $16A_2$) are crystallized by the annealing process, the crystallized copper (Cu) grains have a large grain size on the order of several microns (μm), and the crystal faces (200) of the crystallized Cu appear on the plane parallel to the surface of the semiconductor substrate 10.

Next, referring to FIG. 3B which corresponds to FIG. 2E, by using the CMP process, the redundant metals (Cu, TaN, Ta) are removed from the Cu layers $16A_2$ and $16B_2$, the Cu layers $16A_1$ and $16B_1$, the TaN barrier layers 14A, and the Ta barrier layers 14B. Thus, the wide copper (Cu) wiring layers 16A are formed in the respective wide trenches 12A, and are surrounded by respective metal barrier layers 14A. Also, the narrow copper (Cu) wiring layers 16B are formed in the respective trenches 12B, and are surrounded by respective metal barrier layers 14B.

Note, in FIG. 4, the crystal faces (111) appearing on the polished surface of the crystallized Cu layer regions 161A are represented by reference (111)

Next, referring to FIG. 4 which is a plan view of the insulating interlayer $L_1$ of FIG. 3B (note, FIG. 3B is a cross-sectional view along the B-B line of FIG. 4), each of the wide Cu wiring layers 16A has the plurality of crystallized Cu regions 161A, each of which includes considerably fine copper (Cu) grains as represented by cross hatchings, with each of the fine Cu grains featuring the crystal face (111). Also, each of the wide Cu wiring layers 16A includes a plurality of considerably large copper (Cu) grains 162A derived from the amorphous Cu of the aforesaid semi-amorphous Cu layer ($16A_1$ and $16A_2$) of FIG. 3A, with each of large copper (Cu) grains 162A featuring the crystal face (200). On the other hand, each of the narrow Cu wiring layers 16B includes considerably fine copper (Cu) grains as represented by cross hatchings, with each of the fine Cu grains featuring the crystal face (111).

Next, referring to FIG. 3C which corresponds to FIG. 2F, the wide Cu wiring layers 16A and the narrow Cu wiring layers 16B are subjected to an oxidization process in the same manner as the aforesaid first embodiment. Namely, the cupric oxide (CuO) layer 18A is formed in each of the surfaces of the wide Cu wiring layers 16A except for the Cu regions 161A, and a cupric oxide (CuO) layer 181A is formed in each of the surfaces of the crystallized Cu regions 161A. Also, the cupric oxide (CuO) layer 18B is formed in each of the surfaces of the narrow Cu wiring layers 16B. At the same time, the cupric oxide (CuO) layer 181A has substantially the same thickness as that of the cupric oxide (CuO) layer 18B, with the thickness of the cupric oxide (CuO) layer 181A being larger than that of the cupric oxide (CuO) layer 18A.

Similar to the aforesaid first embodiment, after the oxidization process is completed, each of the cupric oxide (CuO) layers 18A, 181A and 18B is reformed as a cuprite oxide ($Cu_2O$) by treating the cupric oxide (CuO) layers 18A, 181A and 18B with the aqueous washing solution exhibiting the redox (oxidization-reduction) potential falling within the range from 0 to 0.2 (V vs NHE) and the pH falling within the range from 7 to 10.

Similar to the aforesaid first embodiment, after the reformation of the cupric oxide (CuO) layers 18A, 181A and 18B is completed, the semiconductor substrate 10 having the wide Cu wiring layers 16A and the narrow Cu wiring layers 16B is immersed in the CoWP electroplating solution containing the $Cu_2O$ removal agent for removing the cuprite oxide ($Cu_2O$) layer 18A, 181A and 18B from the wide and narrow Cu wiring layers 16A and 16B.

Next, referring to FIG. 3D which corresponds to FIG. 2G, the $Cu_2O$ layers 18A of FIG. 3D are completely removed from the wide wiring layers 16A by the $Cu_2O$ removal agent contained in the CoWP electroplating solution. At this time, however, only a part of the $Cu_2O$ layer 181A is removed from the Cu layer region 161A, and only a part of each of the $Cu_2O$ layers 18B is removed from the narrow wiring layers 16B, because the $Cu_2O$ layers 181A and 18B are thicker than the $Cu_2O$ layers 18A (see: FIG. 3D).

Similar to the aforesaid first embodiment, when the $Cu_2O$ layers 18A of FIG. 3D are completely removed from the wide wiring layers 16A, the wide Cu wiring layers 16A are immediately subjected to the CoWP electroplating process, but the Cu layer region 161A and the narrow Cu wiring layers 16B cannot be subjected to the CoWP electroplating process until the $Cu_2O$ layers 181A and 18B are completely removed from the narrow Cu wiring layers 16B.

Next, referring to FIG. 3E which corresponds to FIG. 2H, the formation of the respective CoWP capping layers 20A on the wide Cu wiring layers 16A is carried out while the $Cu_2O$ layers 181A and 18B is removed from the narrow Cu wiring layers 16B. After the removal of the $Cu_2O$ layers 1181 and 18B is completed, the Cu layer region 161A and the narrow Cu wiring layer 16B are subjected to the CoWP electroplating process.

Next, referring to FIG. 3F which corresponds to FIG. 2I, while the metal (CoWP) capping layers 20A are further grown, a CoWP alloy region 201A is formed as a metal capping region on the Cu layer region 161A. Namely, the metal capping region 201A forms a par of the metal capping layer 20A. On the other hand, similar to the aforesaid first embodiment, the formation of the respective CoWP capping layers 20B on the narrow Cu wiring layers 16B is carried out. When the $Cu_2O$ layers 181A and 18B of FIG. 3D are replaced with the metal capping layers 201A and 20B, the CoWP electroplating process is stopped.

Next, referring to FIG. 3H which corresponds to FIG. 2O, the insulating interlayers $L_2$, $L_3$, $L_4$ and $L_5$ are formed on the insulating interlayer $L_1$ in order in substantially the same manner as in the aforesaid first embodiment.

Figure 3G:
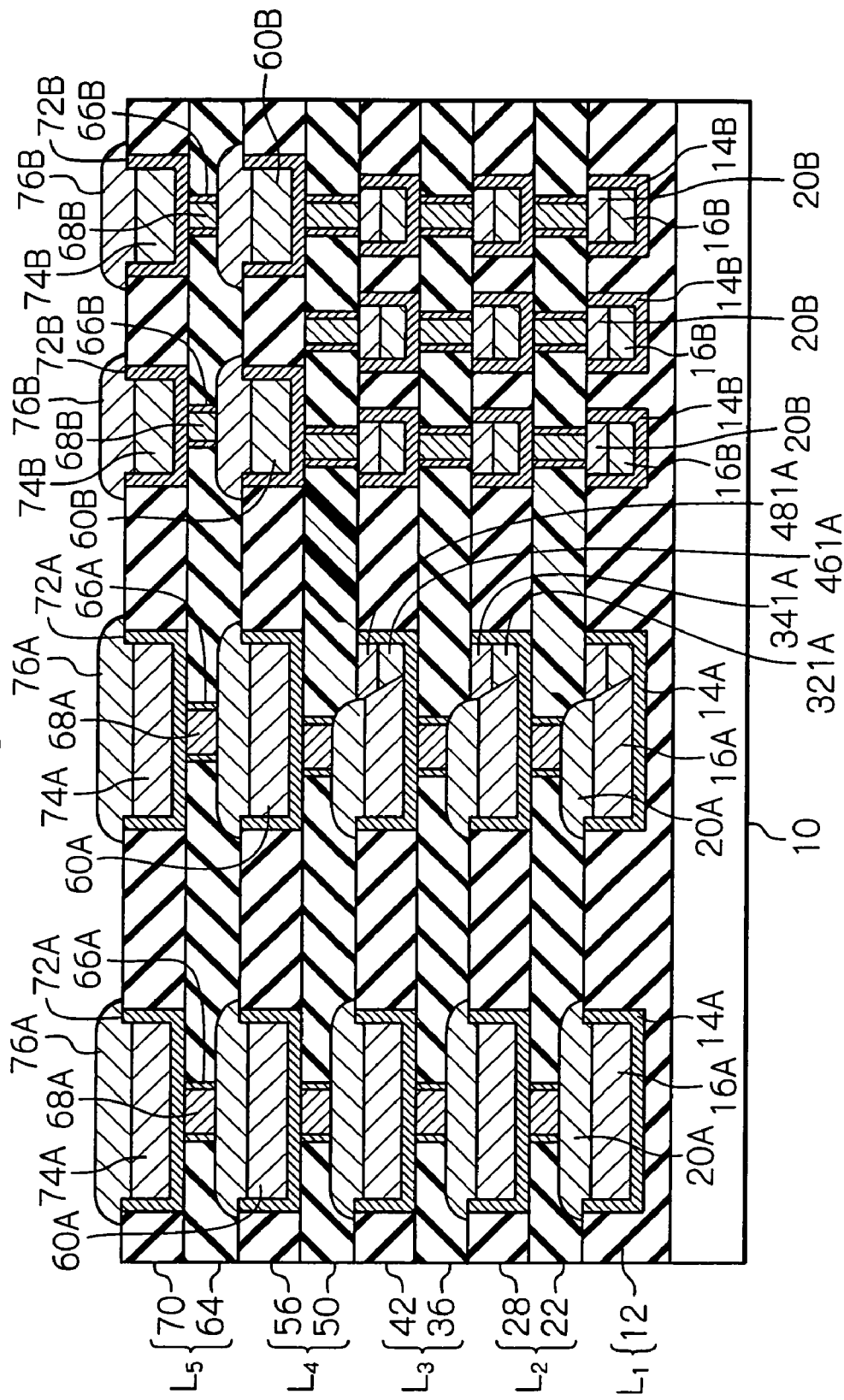

In FIG. 3G, reference 321A indicates a copper (Cu) layer region included in a corresponding wide Cu wiring layer 32A which is formed in the insulating layer 28 of the insulating interlayer $L_2$, reference 341A indicates a metal (CoWP) capping region formed on the copper (Cu) layer region 321A, reference 461A indicates a copper (Cu) layer region included in a corresponding wide Cu wiring layer 46A which is formed in the insulating layer 42 of the insulating interlayer $L_3$, reference 481A indicates a metal (CoWP) capping region formed on the copper (Cu) layer region 461A. In this regard, the second embodiment of FIGS. 3A to 3H is different from the aforesaid first embodiment of FIGS. 2A to 2O.

As stated above, in the second embodiment, although each of the wide Cu wiring layers 16A, 32A and 46A includes the Cu layer region (161A, 321A, 461A) having the fine Cu grains, the Cu layer region (161A, 321A, 461A) is coated and capped with the metal (CoWP) capping region (201A, 341A, 481A). Thus, similar to the aforesaid first embodiment, in the second embodiment, it is possible to improve both the anti-electromigration characteristic and the anti-SIV characteristic without the occurrence of short circuits between the narrow Cu wiring layers 16B, 32B and 46B featuring the minimum line width.

With reference to FIGS. 5A, 5B and 5C, a third embodiment of the method for manufacturing a semiconductor device according to the present invention is explained below.

Similar to the aforesaid second embodiment, in this third embodiment, both the Cu layers $16A_1$ and $16A_2$ are formed as a semi-amorphous copper (Cu) layer in the wide trenches 12A, and the third embodiment is also directed to how the semi-amorphous copper (Cu) layer ($16A_1$ and $16A_2$) is processed.

First, referring to FIG. 5A which corresponds to FIG. 3F, similar to the aforesaid second embodiment, the CoWP electroplating process is continued until the $Cu_2O$ layer 181A and 18B (see: FIG. 3C) are removed from the Cu region 161A and narrow Cu wiring layers 16B, to thereby form the respective CoWP capping layers 20A on the wide Cu wiring layers 16A. Then, the CoWP electroplating process is stopped, and the semiconductor substrate 10 is taken out of the CoWP electroplating solution containing the $Cu_2O$ removal agent.

Next, referring to FIG. 5B, a copper (Cu) silicide region 202A is formed on the Cu region 161A, and copper (Cu) silicide layers 20B' are formed on the narrow Cu wiring layers. The formation of the Cu silicide region 202A and the Cu silicide layer 20B' contributes to the improvement of both the anti-electromigration characteristic and the anti-SIV characteristic in the insulating interlayer $L_1$. Namely, the Cu silicide region 202A serves as a part of the metal capping layer 20A in improving both the anti-electromigration characteristic and the anti-SIV characteristic.

It is possible to carry out the formation of the Cu silicide region 202A and the Cu silicide layers 20B' by utilizing a processing chamber of a CVD apparatus. Namely, in the processing chamber of the CVD apparatus, while the Cu region 161A and the narrow Cu wiring layers 16B are heated to a given high temperature, a semiconductor gas, such as a silane gas ($SiH_4$), a disilane gas ($Si_2H_6$), trisilane gas ($Si_3H_8$) or the like, is blown over the Cu regions 161A and the narrow Cu wiring layers 16B, resulting in the formation of the Cu silicide region 202A and the Cu silicide layer 20B'. The Cu silicide regions 202A has substantially the same thickness as that of the Cu silicide layers 20B', and this thickness is smaller than the CoWP capping layers 20A.

Next, referring to FIG. 5C which corresponds to FIG. 3H, the insulating interlayers $L_2$, $L_3$, $L_4$ and $L_5$ are formed on the insulating interlayer $L_1$ in order in substantially the same manner as in the aforesaid second embodiment.

In FIG. 5C, reference 342A indicates a copper (Cu) silicide layer formed on the copper (Cu) layer region 321A, reference 482A indicates a Cu silicide layer formed on the copper (Cu) layer region 461A, reference 34B' indicates copper (Cu) silicide layers formed on the respective narrow Cu wiring layers 32B, and reference 48B' indicates copper (Cu) silicide layers formed on the respective narrow Cu wiring layers 46B. In this connection, the third embodiment of FIGS. 5A, 5B and 5C is different from the aforesaid second embodiment of FIGS. 3A to 3H.

In the aforesaid first, second and third embodiments, although each of the metal capping layers 20A, 34A, 48A, 62A, 76A, 20B, 34A, 48A, 62A and 76A is composed of CoWP alloy, it may be formed as another alloy layer, such as a CoP alloy layer, a CoWB alloy layer, a CoSnP alloy layer or the like.

Also, in the aforesaid first, second and third embodiments, although the insulating interlayers $L_2$, $L_3$, $L_4$ and $L_5$ are formed by using a single-damascene process, it is possible to use a dual-damascene process for the formation of the insulating interlayers $L_2$, $L_3$, $L_4$ and $L_5$.

Finally, it will be understood by those skilled in the art that the foregoing description is of preferred embodiments of the device and the method, and that various changes and modifications may be made to the present invention without departing from the spirit and scope thereof.

The invention claimed is:

1. A semiconductor device comprising:
   a first wiring layer which is substantially composed of copper;
   a second wiring layer which is substantially composed of copper;
   a first metal capping layer formed on said first wiring layer; and
   a second metal capping layer formed on said second wiring layer;
   wherein a thickness of said first metal capping layer is thicker than that of said second metal capping layer wherein the device further comprising a multi-layered wiring structure, said first and second wiring layers being formed in an insulating interlayer included in said multi-layered wiring structure and said insulating interlayer includes a first barrier layer containing tantalum nitride as a main component and formed between said first wiring layer and said insulating interlayer, and a second barrier layer containing tantalum as a main component and formed between said second wiring layer and said insulating interlayer, a nitrogen density of the first barrier layer being larger than that of the second barrier layer.

2. The semiconductor device as set forth in claim 1, wherein each of the first and second metal capping layers may be composed of one selected from the group consisting of CoWP alloy, CoP alloy layer, CoWB alloy and CoSnP alloy.

3. The semiconductor device as set forth in claim 1, wherein said first wiring layer includes a plurality of crystallized copper grains, crystal faces (200) of which appear on a surface of said first wiring layer, said first metal capping layer being formed on the surface of said first wiring layer which is featured by the crystal faces (200), and wherein said second wiring layer includes a plurality of second crystallized copper grains, crystal faces (111) of which appear on a surface of said second wiring layers, said second capping layer being formed on the surface of said second wiring layer which is featured by the crystal faces (111).

4. The semiconductor device as set forth in claim 1, wherein said first wiring layer includes a plurality of crystallized copper grains, crystal faces (200) of which appear on a surface of said first wiring layer, and a plurality of crystallized copper regions each having a plurality of crystallized grains, crystal faces (111) of which appear on a surface of said first wiring layer, and wherein a metal capping region is formed on each of said crystallized copper regions which is featured by said crystal faces (111), the metal capping regions forming a part of said first metal capping layer, an thickness of each of said metal capping layers being substantially equivalent to that of said second metal capping layer.

5. The semiconductor device as set forth in claim 4, wherein said second wiring layer includes a plurality of second crystallized copper grains, crystal faces (111) of which appear on a surface of said second wiring layers, said second capping layer being formed on the surface of said second wiring layer which is featured by the crystal faces (111).

6. The semiconductor device as set forth in claim 1, wherein the formation of said first metal capping layer on said first wiring layer is partially carried out, and wherein a copper silicide layer is formed on a remaining area on said first wiring layer from which the formation of said first metal capping layer is excluded.

7. The semiconductor device as set forth in claim 6, wherein said second metal capping layer is formed as a copper silicide layer.

8. A semiconductor device comprising:
   at least two first wiring layers which are substantially composed of copper, and which are arranged so as to be apart from each other at a first pitch;
   at least two second wiring layers which are substantially composed of copper, and which are arranged so as to be apart from each other at a second pitch narrower than said first pitch;
   a plurality of first metal capping layers, each of which is formed on one of said first wiring layers; and
   a plurality of second metal capping layers, each of which is formed on one of said second wiring layers;

wherein a thickness of said first metal capping layers is thicker than that of said second metal capping layer wherein the device further comprising a multi-layered wiring structure, said first and second wiring layers being formed in an insulating interlayer included in said multi-layered wiring structure and said insulating interlayer includes a first barrier layer containing tantalum nitride as a main component and formed between said first wiring layer and said insulating interlayer, and a second barrier layer containing tantalum as a main component and formed between said second wiring layer and said insulating interlayer, a nitrogen density of the first barrier layer being larger than that of the second barrier layer.

9. The semiconductor device as set forth in claim 8, further comprising a multi-layered wiring structure, said first wiring layers being formed in an insulating interlayer included in said multi-layered wiring structure, said second wiring layers being formed in another insulating interlayer included in said multi-layered wiring structure.

10. A semiconductor device, comprising:
a first wiring layer which is substantially composed of copper;
a second wiring layer which is substantially composed of copper;
a first metal capping layer formed on said first wiring layer; and
a second metal capping layer formed on said second wiring layer;
wherein a thickness of said first metal capping layer is thicker than that of said second metal capping layer, and
wherein bottom surfaces of said first and second wiring layers are substantially coplanar wherein the device further comprising a multi-layered wiring structure, said first and second wiring layers being formed in an insulating interlayer included in said multi-layered wiring structure and said insulating interlayer includes a first barrier layer containing tantalum nitride as a main component and formed between said first wiring layer and said insulating interlayer, and a second barrier layer containing tantalum as a main component and formed between said second wiring layer and said insulating interlayer, a nitrogen density of the first barrier layer being larger than that of the second barrier layer.

* * * * *